US009600604B2

(12) United States Patent
CaraDonna et al.

(10) Patent No.: US 9,600,604 B2
(45) Date of Patent: Mar. 21, 2017

(54) SYSTEM AND METHOD FOR PLANNING AN UPGRADE OF A MODULAR COMPUTING SYSTEM

(71) Applicant: NetApp, Inc., Sunnyvale, CA (US)

(72) Inventors: Joseph CaraDonna, Ashland, MA (US); Steven C. Miller, Livermore, CA (US); Stephen W. Daniel, Durham, NC (US); Rodney A. DeKoning, Wichita, KS (US); Gaurav Makkar, Noida (IN); Brian Hackworth, San Jose, CA (US); Michael S. Riley, Naperville, IL (US); Valentin M. Bercovici, Nepean (CA)

(73) Assignee: NETAPP, INC., Sunnyvale, CA (US)

(*) Notice: Subject to any disclaimer, the term of this patent is extended or adjusted under 35 U.S.C. 154(b) by 499 days.

(21) Appl. No.: 13/945,634

(22) Filed: Jul. 18, 2013

(65) Prior Publication Data

US 2015/0026621 A1    Jan. 22, 2015

(51) Int. Cl.
*G06F 3/048* (2013.01)
*G06F 3/00* (2006.01)
*G06F 17/50* (2006.01)

(52) U.S. Cl.
CPC .............. *G06F 17/50* (2013.01); *G06F 3/048* (2013.01)

(58) Field of Classification Search
CPC ............. G06F 3/048; G06F 3/00; G06F 17/50
See application file for complete search history.

(56) References Cited

U.S. PATENT DOCUMENTS

| 4,916,637 A * | 4/1990 | Allen ...................... G06F 1/181 700/104 |
| 5,850,539 A * | 12/1998 | Cook ...................... G06F 17/50 703/20 |
| 6,182,020 B1 * | 1/2001 | Fairbanks ........... G06F 17/5022 324/76.11 |
| 6,384,482 B1 * | 5/2002 | Yang ................. H01L 21/76819 257/758 |

(Continued)

OTHER PUBLICATIONS

McDermott John, A Rule-Based Configurer of Compuer Systems, DTIC, Apr. 1980, pp. 1-56.*

*Primary Examiner* — Jennifer To
*Assistant Examiner* — Hugo Molina
(74) *Attorney, Agent, or Firm* — Klein, O'Neill & Singh, LLP

(57) ABSTRACT

A system and method for planning and configuring the components of a modular computing system is provided. In some embodiments, the method for planning an implementation of a modular computing system comprises presenting a user interface at a display device, the user interface including a plurality of user-selectable objects, each of the user-selectable objects representing a component of the modular computing system. A user selection is received via a user input device. The user selection is from among the user-selectable objects and specifies one of an enclosure, an existing component, and a future component of the modular computing system. A representation of the specified one of an enclosure, an existing component, and a future component is displayed at a display device. The user selection is verified with respect to an implementation guideline. An indicator of whether the user selection meets the implementation guideline is displayed at the display device.

16 Claims, 11 Drawing Sheets

(56) References Cited

U.S. PATENT DOCUMENTS

| | | | | |
|---|---|---|---|---|
| 6,543,047 B1* | 4/2003 | Vrhel, Jr. | ............ | G06F 11/3672 |
| | | | | 714/E11.208 |
| 7,054,836 B2* | 5/2006 | Christensen | ......... | G06Q 10/087 |
| | | | | 705/26.5 |
| 7,286,969 B2* | 10/2007 | Shahoumian | ......... | G06F 17/509 |
| | | | | 211/26 |
| 7,857,214 B2* | 12/2010 | Saliaris | ................... | G06F 1/181 |
| | | | | 235/383 |
| 2007/0174107 A1* | 7/2007 | Aravamudan | ....... | G06Q 10/101 |
| | | | | 705/300 |
| 2007/0180052 A1* | 8/2007 | Zomaya | .................... | G06F 8/64 |
| | | | | 709/217 |
| 2007/0300204 A1* | 12/2007 | Andreev | ................... | G06F 8/10 |
| | | | | 717/104 |
| 2009/0138313 A1* | 5/2009 | Morgan | ................. | G06Q 10/06 |
| | | | | 705/7.23 |
| 2012/0198368 A1* | 8/2012 | Bornheimer | .............. | G06F 8/77 |
| | | | | 715/763 |
| 2013/0086541 A1* | 4/2013 | Luo | .................... | G06F 17/5081 |
| | | | | 716/112 |
| 2014/0163713 A1* | 6/2014 | Ross | ...................... | G06Q 10/04 |
| | | | | 700/108 |

* cited by examiner

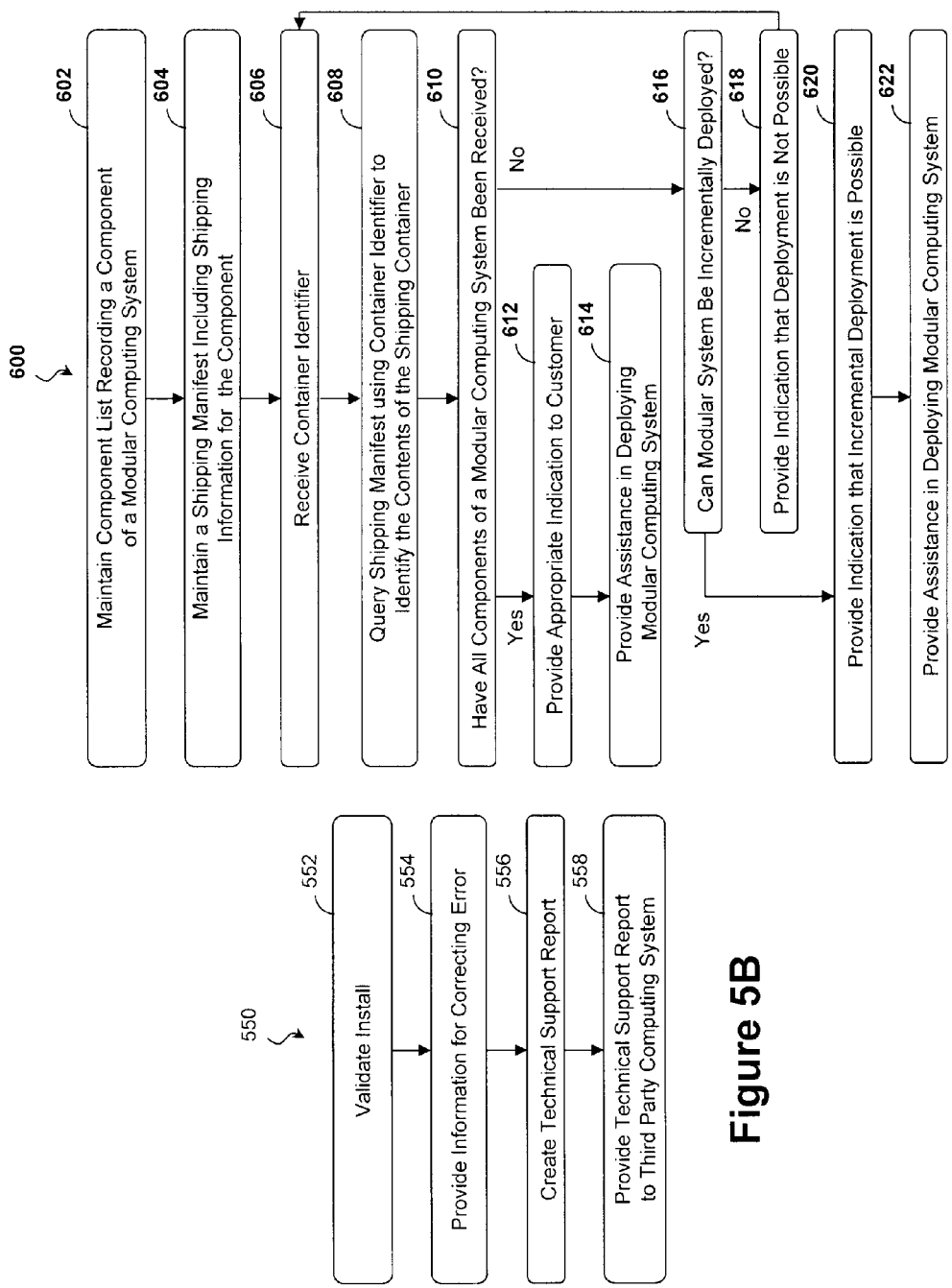

SYSTEM AND METHOD FOR PLANNING AN UPGRADE OF A MODULAR COMPUTING SYSTEM

TECHNICAL FIELD

The present description relates to computing systems and more specifically to the planning, installation, and verification of modular computing systems.

BACKGROUND

Rising demand for computing resources have driven customers towards increasingly robust computing systems and infrastructures. Understandably, customers are requesting customized hardware and software solutions in order to maximize performance and control costs. In other words, customers won't pay for what they don't need, and vendors have responded accordingly. As merely one example, enterprise-class storage systems may be purchased in a wide array of storage, processing, and networking configurations. Many customers also request systems that are upgradable over time in order to preserve some of the customer's substantial investment. However, both vendors and customers have been forced to carefully balance flexibility against system complexity, which tends to increase support costs and reduce system reliability.

Further complicating the situation, some customers choose to reduce costs by performing their own system installation, maintenance, and support. While this may prove economical, the customer's technicians may not be as familiar with a system as the vendor. This can lead to substantial challenges over the life cycle of the system, particularly during the labor-intensive deployment phase. Vendors are left with the task of providing a system that is tailored to the customer's needs, that can be upgraded as those needs change, and that is straightforward to install and operate. Thus, while conventional techniques for planning, deploying, and managing computing system have proved generally adequate, further improvements are desirable.

In particular, improved planning may allow vendors to better customize their solutions to meet the customer's needs and to integrate seamlessly with a customer's existing infrastructure. Improvements in installation and deployment may reduce the time needed to bring a system on-line, reduce the number of costly support calls, and improve customer satisfaction and loyalty. When components do fail, better diagnostic and support methods may allow systems to be restored in less time and with fewer misdiagnoses. For these reasons and more, improved planning and deployment techniques benefit both vendors and their customers.

BRIEF DESCRIPTION OF THE DRAWINGS

The present disclosure is best understood from the following detailed description when read with the accompanying figures.

FIG. 5B is a flow diagram of a method of monitoring the deployment of a modular computing system according to aspects of the present disclosure.

FIGS. 6A and 6B are flow diagrams of a method of managing the deployment of a modular computing system according to aspects of the present disclosure.

DETAILED DESCRIPTION

Figure 1B:
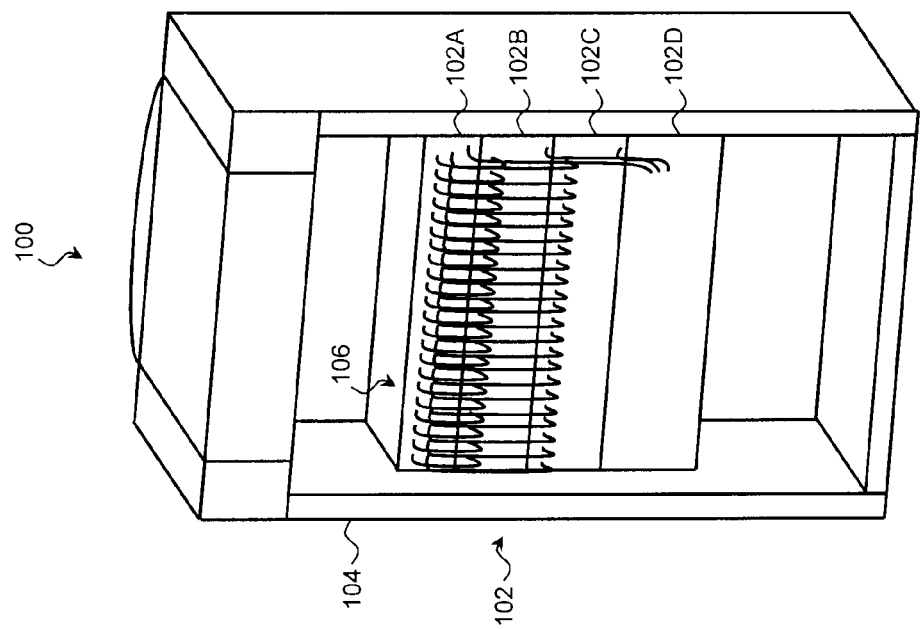
FIGS. 1A and 1B are perspective diagrams of a modular computing resource according to aspects of the present disclosure.

All examples and illustrative references are non-limiting and should not be used to limit the claims to specific implementations and embodiments described herein and their equivalents. The headings are solely for formatting and should not be used to limit the subject matter in any way, because text under one heading may cross reference or apply to text under one or more headings. Finally, in view of this disclosure, particular features described in relation to one aspect or embodiment may be applied to other disclosed aspects or embodiments of the disclosure, even though not specifically shown in the drawings or described in the text.

The present disclosure relates to systems and methods for planning, deploying, and maintaining computing systems. In some embodiments, a tracking and planning system is provided that allows customers to track purchased parts during shipping. The tracking and planning system correlates the purchased parts with the package or container used to ship the parts. When a container arrives, the tracking and planning system scans the container and logs the parts as received. In some embodiments, when sufficient parts have arrived, the tracking and planning system informs the customer that the parts are ready to be unboxed and assembled into a computing system. This may include informing the customer when sufficient parts have arrived to incrementally deploy the computing system. Incremental deployment brings a portion of the system on line, occasionally with diminished performance and often with the expectation that the remainder will be installed and assembled when the parts arrive.

In some embodiments, a tracking and planning system is provided that guides a customer in unboxing and assembling a computing system. So that the assembly proceeds in an orderly fashion, the tracking and planning system may provide a customer with a description of a box containing a first component to be installed and may provide customized installation instructions. After the customer installs the first component, the tracking and planning system establishes a connection to the first component and performs various diagnostic and/or configuration tasks. Once the first component is installed and verified, the tracking and planning system can then guide the customer to the box containing the next component. In some embodiments, by monitoring the status of the installation, the tracking and planning system can alert the customer to an installation error such as an incorrect connection before the install process progresses much further. For more serious errors, the tracking and planning system can prepare a diagnostic report to send to a technician.

In some embodiments, a tracking and planning system is provided with an interface that allows customers to fill a virtual computer enclosure with virtual computing modules to determine how well a configuration works with a system or systems already in place. For example, a rack-type enclosure may be used to house more than one independent system provided that there are no spacing, wiring, power, cooling, weight, or other conflicts. Before purchasing a new system, the customer and the vendor may utilize the tracking and planning system to determine whether the new system can be integrated into the customer's existing infrastructure or whether additional resources will be needed. Of course, it is understood that these features are exemplary and non-limiting, and no particular feature is required for any particular embodiment.

Figure 1A:
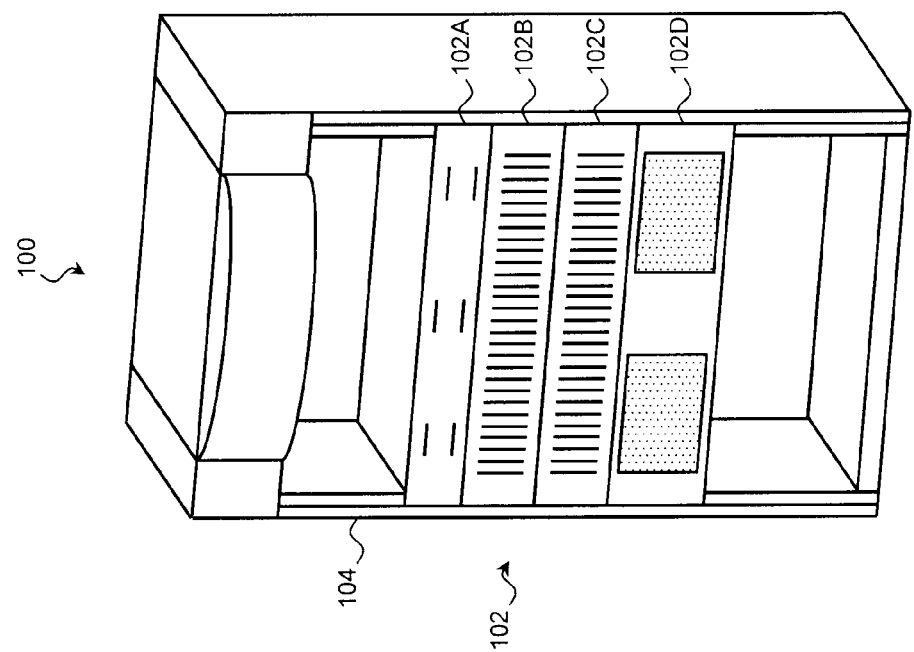

FIGS. 1A and 1B are perspective diagrams of a modular computing system 100 according to aspects of the present disclosure. Typically, a modular computing system 100 delivers flexibility and performance in a small footprint by incorporating interconnected computing modules 102 housed within one or more standardized enclosures 104. Customers can expand capacity by adding additional modules 102, often within the same enclosure 104. In the illustrated embodiment, the modular computing system 100 includes one or more modules 102 (e.g., modules 102A, 102B, 102C, and 102D), which are capable of being communicatively coupled to each other and to other systems, devices, and networks.

Each module 102 may be a single-purpose device or a multi-purpose device, and accordingly, each module 102 may include a single type of computing resource or a combination of resources. Thus, modules 102 may include any combination of processing resources (e.g., CPUs, GPUs, ASICs, FPGAs, DSPs, etc.), communications resources (e.g., wired and/or wireless communications resources), storage resources (e.g., non-volatile storage resources), power resources (e.g., power supplies, uninterruptable power supplies, line conditioners, etc.), input/output devices (e.g., mouse, keyboard, monitor, touch surface, etc.), and/or other computing resources. In an exemplary embodiment, module 102A includes a storage controller, such as an FAS (Fibre-Attached Storage) controller, while modules 102B and 102C include storage devices such as magnetic storage devices, solid-state storage devices, optical storage devices, cache memory devices, Random Access Memory (RAM), and/or other suitable storage media. In the embodiment, module 102D includes a multi-channel power supply. Of course, this combination of modules 102 is merely exemplary and no particular individual modules or module-based resources are required for any particular embodiment.

The modules 102 are housed in one more enclosures 104, which may provide physical support as well as providing routing channels, cable management, power, and/or cooling. The enclosure may take any suitable form including a rack enclosure, a tower enclosure, a blade enclosure, and/or other suitable enclosure. The illustrated embodiments of FIGS. 1A and 1B may be referred to as rack-mounted modular computer system 100. However, the principles of the present disclosure apply equally to any and all other physical arrangements including tower and blade arrangements.

The modules 102 may be communicatively coupled to each other as well as to other computing resources. In that regard, the modules 102 may be coupled by any communications interface including wired connections 106 such as serial ATA, SCSI (Small Computer System Interface), Fibre Channel, PCIe (Peripheral Component Interconnect Express) Ethernet, USB, Thunderbolt, IEEE 1394/FireWire, and/or other suitable connections. In some embodiments, one or more wired connections 106 may be integrated into a backplane of the enclosure 104. The modules 102 may be coupled by wireless connections using protocols such as IEEE 802.11/Wi-Fi standards, Ultra Wide-Band (UWB) standards, Bluetooth, wireless FireWire, wireless USB, and/or other suitable protocols. In addition to communications connections, wired connections 106 may include power connections, such as AC and DC power connections between modules 102 as well as power connections to sources outside the modular computing system 100. While only a few connections 106 are illustrated, the total number of connections within an enclosure 104 can be substantial.

Figure 2:
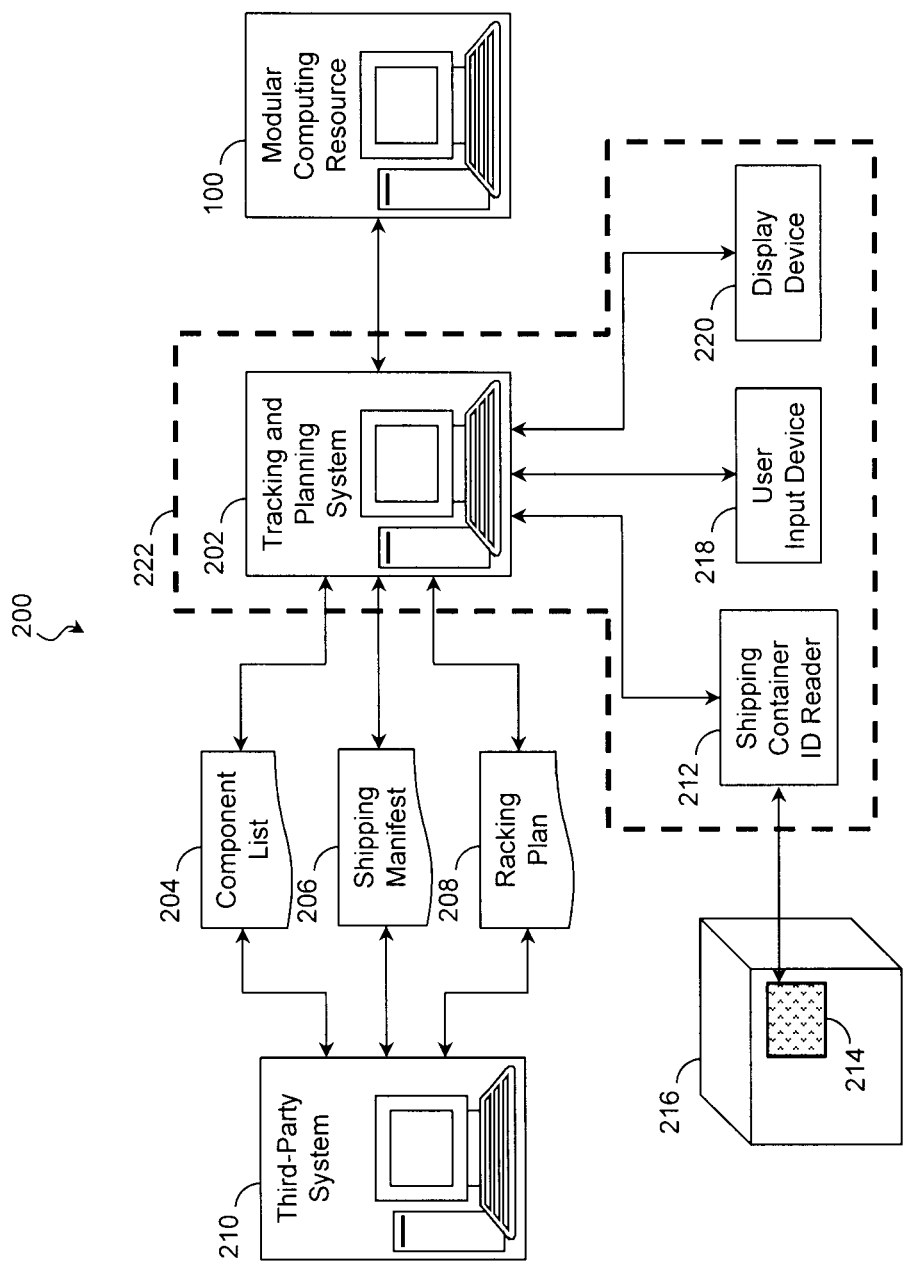
FIG. 2 is a schematic diagram of a computing infrastructure for supporting the installation, verification, maintenance, and operation of a modular computing resource according to aspects of the present disclosure.

Accordingly, despite the convenience of a modular design, the installing, connecting, and configuring the components of the modular computing system 100 may still be both complicated and time-consuming. The process may also be error prone. However, this burden can be lessened through the use of tools that assist the customer in planning, deploying, and maintaining a modular computing system 100. FIG. 2 is a schematic diagram of a computing infrastructure 200 for supporting the installation, verification, maintenance, and operation of a modular computing system 100 according to aspects of the present disclosure.

The computing infrastructure 200 includes a tracking and planning system 202 that in various embodiments is operable to provide an interface for planning changes to a modular computing system 100, to tracking the shipment of purchased components, to indicate when sufficient components have been received to assemble the modular computing system 100, to guide a customer in deploying the modular computing system 100, and/or to updating or install software and firmware components of the modular computing system 100. These operations of the tracking and planning system 202 and others are disclosed in further detail below.

The tracking and planning system 202 may include a processor such as a microcontroller or a dedicated central processing unit (CPU), a non-transitory computer-readable storage medium (e.g., a hard drive, random access memory (RAM), a compact disk read only memory (CD-ROM), etc.), a video controller such as a graphics processing unit (GPU), and a network communication device such as an Ethernet controller or wireless communication controller. In that regard, in some embodiments, the tracking and planning system 202 is programmable and is programmed to execute processes including those associated with planning, tracking, installation, and configuration of a modular computing system 100. Accordingly, it is understood that any operation of the tracking and planning system 202 according to the aspects of the present disclosure may be implemented by the tracking and planning system 202 using corresponding instructions stored on or in a non-transitory computer readable medium accessible by the processing system.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

The tracking and planning system 202 may take the form of a desktop computing device, a personal computing device, a laptop, a personal digital assistant, a tablet computer, a mobile communications device, and/or another suitable configuration. Further, in some instances, the tracking and planning system 202 comprises a plurality of computing devices. In that regard, the different operations of the present disclosure may be implemented separately or within predefined groupings using the plurality of computing devices. In one such embodiment, the tracking and planning system 202 includes a desktop and/or laptop component and a hand-held device (e.g., a personal digital assistant, tablet computer, mobile communications device, etc.). Any other divisions and/or combinations of the functionality described below distributed across multiple computing devices are within the scope of the present disclosure.

In various embodiments, the tracking and planning system 202 is operable to receive one or more data files such as component lists 204, shipping manifests 206, and/or racking plans 208, each of which is disclosed in detail below. The data files may be generated, in whole or in part, by the tracking and planning system 202 and/or may be received from a third-party computing system 210, such as that of a shipper, manufacturer, or sales facility. Accordingly, the tracking and planning system 202 may be operable to interface with one or more computing systems 210 over a communications infrastructure such as a Local Area Network (LAN), Wide Area Network (WAN), and/or the Internet. The data files may take any form and may be discrete files, file portions, and/or any other data structure. In an exemplary embodiment, one or more data files include queries to be run on a database of customer information.

In some embodiments, the tracking and planning system 202 is communicatively coupled to an ID (identifier) reader device 212 operable to recognize or "read" an identifier 214 of a shipping container 216. In an exemplary embodiment, the ID reader 212 includes a laser and receiver pair operable to read a barcode-based identifier. In a further embodiment, the ID reader 212 includes an RFID (radio-frequency identification) scanner operable to read RFID tags. In another embodiment, the ID reader 212 includes a digital camera and an image processing resource operable to recognize an identifier such as a barcode, identifying text, and/or other mark from a captured image. The ID reader 212 may include a desktop computing device, a personal computing device, a laptop, a personal digital assistant, a tablet computer, a mobile communications device, and/or another suitable computing device, and portions of the ID reader 212 may be incorporated into a component of the tracking and planning system 202 such as a hand-held device (e.g., a personal digital assistant, tablet computer, mobile communications device, etc.) of the tracking and planning system 202. For example, in one such embodiment, the ID reader 212 is incorporated into a mobile communications device.

The tracking and planning system 202 may be communicatively coupled to one or more user input devices 218 and/or display devices 220. Examples of suitable user input devices 218 include, but are in no way limited to, keyboards, keypads, mice, trackballs, digital pens, touch-based interfaces, gesture-based interfaces, verbal and speech-recognition interfaces, adaptive interfaces, cameras, motion-sensing interfaces, and other user input devices known to one of skill in the art. In various exemplary embodiments, the tracking and planning system 202, the ID reader 212, the user input device 218, and the display device 220 are integrated into a single hand-held device as indicated by dashed box 222. In one such embodiment, the tracking and planning system 202, the ID reader 212, the user input device 218, and the display device 220 are integrated into a mobile communications device.

Figure 3:
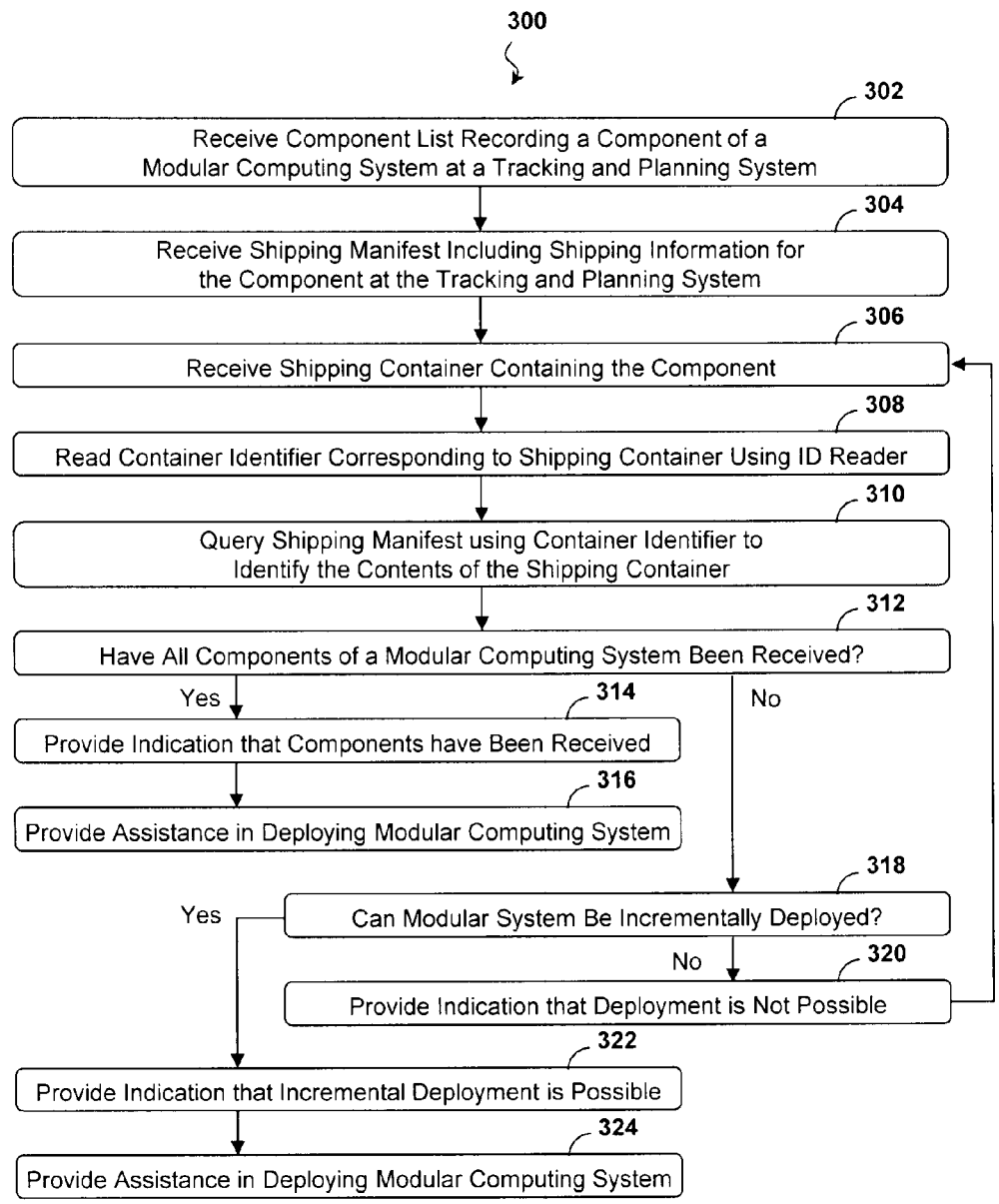
FIG. 3 is a flow diagram of a method of tracking the shipping and receipt of components of a modular computing system according to aspects of the present disclosure.

Various functionality of the tracking and planning system 202 is disclosed with respect to the following figures. In some embodiments, the tracking and planning system 202 is operable to monitor the status of a customer's order and to notify the customer when sufficient parts have arrived to deploy a modular computing system 100. FIG. 3 is a flow diagram of a method 300 of tracking shipping and receipt of components of a modular computing system 100 according to aspects of the present disclosure. It is understood that additional steps can be provided before, during, and after the steps of method 300, and that some of the steps described can be replaced or eliminated for other embodiments of the method. The method 300 is suitable for performing using a tracking and planning system 202 such as that disclosed with reference to FIG. 2.

Referring to block 302, a component list 204 for one or more modular computing systems is received at the tracking and planning system 202. The component list 204 may include a record of customer purchases and may also include components the customer currently has on hand, components ordered but not yet received, and/or components identified for future purchase. Possible components include any tangible or intangible consumer goods and services. In that regard, the component list 204 may include modules 102, enclosures 104, connectors, cables, fasteners, and/or other accessories. The component list 204 may also include intangible components including software products, licenses, services (e.g., technical support), warranties, user accounts, and/or other intangible goods. In an exemplary embodiment, the component list 204 includes a list of goods and services for use in a modular computing system 100. Accordingly, the exemplary component list 204 includes entries corresponding to one or more modules 102, enclosures 104, connectors, cables, software, and/or other components. In some embodiments, the component list 204 includes a status for each component indicating whether the corresponding component is in the customer's hands, is purchased but not received, or has not yet been purchased.

Referring to block 304, a shipping manifest 206 is received at the tracking and planning system 202. The shipping manifest 206 contains shipping information for components including those of the component list 204 and may be used to track the shipping of individual components while en route and to record of the contents of a particular shipping container 216. In order to distinguish containers, each shipping container 216 may have a unique container identifier 214 applied to it. The container identifier 214 may take any suitable human-readable or machine-readable form. In various embodiments, containers are marked and associated with a sequence of letters and/or numbers (alphanumeric), a linear code (1d barcode), a matrix code (2d barcode) (e.g., UPCA, QR Code®, a trademark of Denso Wave Inc., Data Matrix, PDF417, etc.) and/or other suitable identifying codes. In a further exemplary embodiment, a container is marked with an RFID (radio-frequency identification) tag readable using an RFID scanner. The shipping manifest 206 includes a representation of the container identifier 214 for the various shipping containers 216. In this way, the shipping manifest 206 can be queried determine components within a shipping container 216 based on the container identifier 214. In further embodiments, the shipping manifest 206 also correlates components with shipper names, dates shipped, destinations where the components were received, and/or other suitable shipping information.

In many embodiments, a single order may be divided into multiple shipments. Each shipment may be made independently by an independent shipping entity. For this reason and others, the tracking and planning system 202 may be operable to receive and manage the multiple shipping manifests 206. In one such embodiment, the tracking and planning system 202 merges shipping manifests 206 into a master manifest, which it updates as subsequent shipping manifests 206 are received.

Referring to block 306, the customer receives a shipping container 216 holding components of the modular computing system 100. Because of the number of containers, the customer may not know whether all of the shipping containers 216 have been received and whether enough components have arrived to begin deploying the modular computing system 100. Deploying includes the physical assembly, booting, hardware and software configuration, and/or other steps performed in order to make the system operational.

Referring to block 308, a container identifier 214 corresponding to one of the one or more received shipping container 216 is read using an ID reader 212. As disclosed above, containers may be identified using any suitable human-readable or machine-readable identifying code. Accordingly, the tracking and planning system 202 may receive from the ID reader 212, as merely some examples, a sequence of letters and/or numbers, a data value representing a machine-scanned optical code, and/or a data value representing an RFID value. In a further exemplary embodiment, the tracking and planning system 202 receives a digital image and performs an optical pattern recognition process on the image to determine a container identifier 214 from the digital image.

Referring to block 310, the tracking and planning system 202 queries the shipping manifest 206 based on the container identifier to determine the component or components within the identified container 216. Thus using the container identifier, the tracking and planning system 202 determines those components that the customer has received without requiring the customer to unpack and inventory the contents. Once the components have been identified, the tracking and planning system 202 may also record that the components have been received. In one such embodiment, the tracking and planning system updates the component list 204 to indicate that the respective components have been received and to include the respective container identifier 214.

Referring to block 312, the tracking and planning system 202 queries the component list 204 to determine whether all the components of a modular computing system 100 have been received. If so, in block 314, the tracking and planning system 202 provides the customer with an appropriate indication at a display device 220 that the components have been received and/or that the system 100 is ready for deployment. The indication may include a list of the components, dates components were received, respective container identifiers for the components, and/or other suitable user information. In some embodiments, the component list 204 corresponds to more than one modular computing system 100. In such embodiments, the tracking and planning system 202 may determine whether the components of at least one of the modular computing system 100 has been received and if so, provides the appropriate indication at the display device. After providing the indication that all the component have been received, the tracking and planning system 202 may then proceed to assist the customer in deploying the modular computing system 100 as disclosed in block 316 and FIGS. 4-5.

If the analysis of the component list 204 in block 312 determines that some but not all of the components of a modular computing system 100 have been received, the method 300 proceeds to block 318. In block 318, the tracking and planning system 202 determines from the component list 204 whether an incremental deployment of the modular computing system 100 is possible based on the components that have been received. An incremental deployment brings a portion of the modular computing system 100 on-line with the expectation that further portions of the system 100 will be deployed later. In the interim, the incrementally deployed system 100 may provide reduced functionality (e.g., reduced computing, storage, and/or network capacity) but not necessarily, and in many embodiments, an incrementally deployed system 100 suffers no performance impact. When an incrementally deployed system 100 does provide reduced functionality, this may be remedied as additional components are received by the customer and the remaining portions are deployed. In a particular application, the incrementally deployed system 100 provides no functionality. For example, it may save time to begin installing components of a modular computing system before a power supply has been received. In such applications, tracking and planning system 202 may alert the user to the fact that the incrementally deployed system 100 will not operate.

In order to determine whether an incremental deployment is possible, the tracking and planning system 202 may consider any relevant factor. In some embodiments, the considerations include determining whether the received components have sufficient computing resources (e.g., processing, storage, communication, cooling resources, power resources, etc.) to meet a minimum requirement to deploy a modular computing system 100. For example, if no power supply has been received, a deployment may not be possible. In a further embodiment, the tracking and planning system 202 determines whether at least one processing resource, at least one storage resource, at least one communication resource, and at least one power resource has been received by the customer. If so, an incremental deployment may be possible. As another example, the determination of whether an incremental deployment is possible may include evaluating available enclosure space (e.g., space within a rack or blade enclosure).

In some embodiments, determining whether an incremental deployment is possible includes assessing the process required for adding additional components to the incrementally deployed modular computing system 100 and thereby deploying the remainder. In various embodiments, the tracking and planning system 202 considers wiring changes, racking changes, hardware and software configuration changes, power and cooling changes, and/or other modifications the customer will be expected to perform when the remaining components are received. The tracking and planning system 202 may determine a difficulty assessment and/or an estimated time needed to implement the initial (incremental) deployment and/or to subsequently deploy the remainder and upgrade the incremental deployment to full operating status.

In some embodiments, determining whether an incremental deployment is possible includes determining what commonly-available components the customer already has on hand. For example, if the customer has accessories such as fasteners, cables, connectors, and/or conduit that are suitable substitutes for those that have not yet arrived, an incremental deployment may be possible. Accordingly, in some such embodiments, the tracking and planning system 202 compares the components that have not yet arrived against a list of commonly-available components obtained from the component list 204 and/or the user input device 218.

Information used to determine whether an incremental deployment is possible including minimum resource requirements, installation process information such as time and difficulty, and/or other relevant information may be contained within in a database stored on the tracking and planning system 202, the third-party system 210, and/or other computing resource. Accordingly, determining whether an incremental deployment is possible may include one or more queries to a deployment information database.

If it is determined in block 318 that an incremental deployment is not possible, in block 320, the tracking and planning system 202 may present an indication at the display device 220 that some of the components have not been received and that the modular computing system 100 is not ready to be deployed. The indication may include a list of all components, a list of components that have not been received, an expected date of arrival for a component that has not been received, a date a received component was received, a respective container identifier for a received component, and/or other suitable information. The tracking and planning system 202 may then return to block 306 and await the receipt of further shipping container identifiers 214.

If it is determined in block 318 that an incremental deployment is possible, in block 322, the tracking and planning system 202 provides an appropriate indication at a display device 220. In some embodiments, the tracking and planning system 202 provides a list of the components, a list of components that have not been received, an expected date of arrival for a component that has not been received, a date a received component was received, a respective container identifier for a received component, and/or other suitable user information. The tracking and planning system 202 may also present information pertaining to the potential incremental deployment such an amount or percentage of functionality the incrementally deployed system can provide, a difficulty in upgrading the system as additional components arrive, an estimated time to upgrade the system as additional components arrive, commonly-available components the customer may have on hand, and other relevant details.

If customer does not wish to perform an incremental deployment, the tracking and planning system 202 may return to block 308 to await receipt of subsequent container identifiers 214. In some embodiments, the tracking and planning system 202 interprets the subsequent receipt of another container identifier as an indication that the customer is still scanning containers and does not wish to assemble an incrementally-deployed system at this time.

Figure 4:
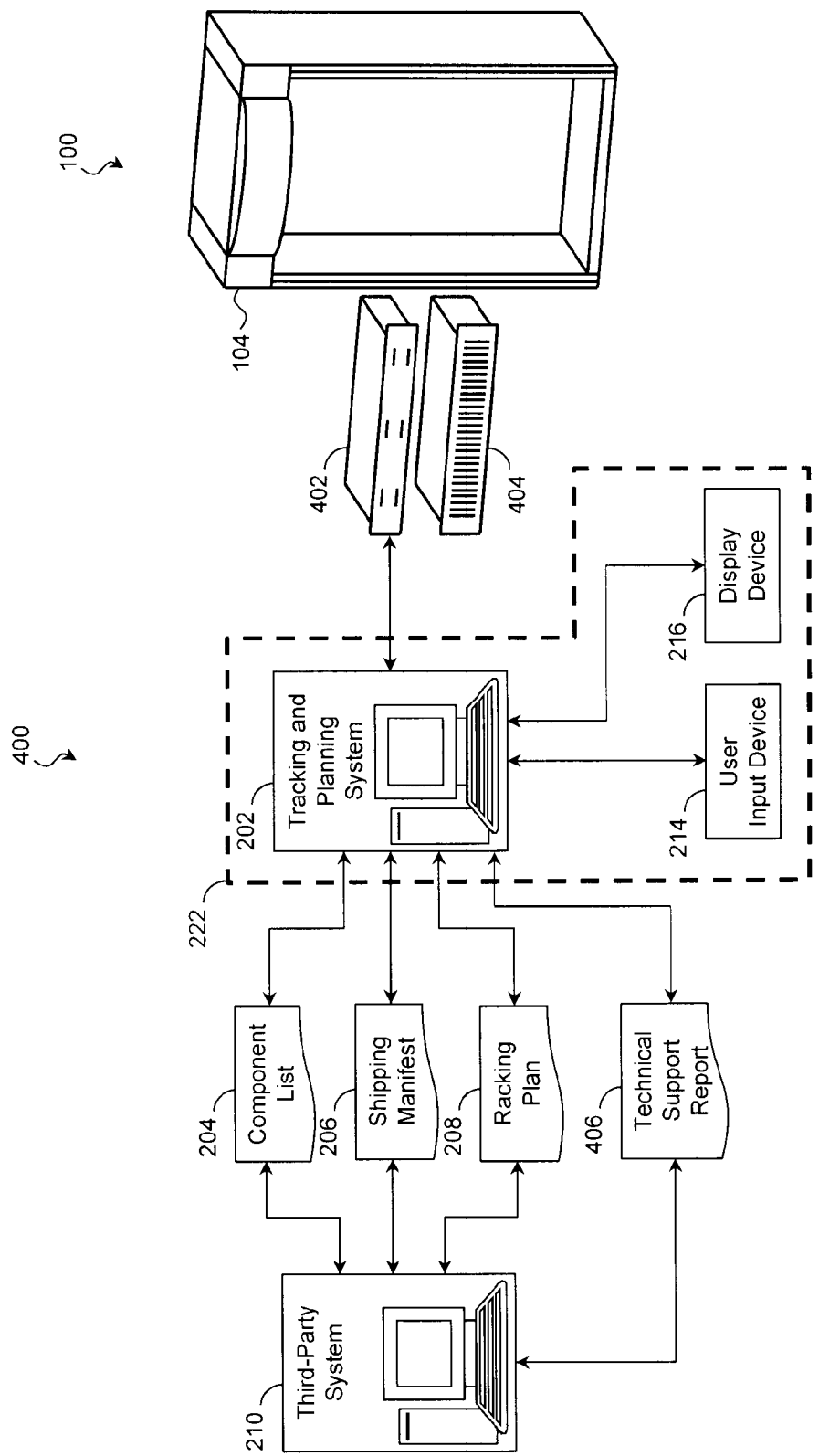
FIG. 4 is a schematic diagram of a computing infrastructure including a modular computing system undergoing deployment according to aspects of the present disclosure.

On the other hand, if the customer is ready to proceed with an incremental deployment, the method 300 may proceed to block 324 where the tracking and planning system 202 assists the customer in assembling, configuring, booting, and bringing the incrementally-deployed modular computing system 100 into service as disclosed with respect to FIGS. 4-5.

As disclosed above, when the components are available to assemble a modular computing system 100, either in whole or in part, the tracking and planning system 202 may provide detailed steps guiding the customer through the deployment. A method of deploying a modular computing system 100 and of providing customer guidance during the deployment is disclosed with reference to FIGS. 4, 5A, and 5B. FIG. 4 is a schematic diagram of a computing infrastructure 400 including a modular computing system 100 undergoing deployment according to aspects of the present disclosure. The modular computing system 100 includes an enclosure 104, a primary component 402 and one or more secondary components 404. The computing infrastructure 400 also includes a tracking and planning system 202, a component list 204, a shipping manifest 206, a racking plan 208, a third-party system 210, an ID reader 212, a user input device 218, and a display device 220, each substantially similar to those disclosed with reference to FIG. 2. In that regard, the tracking and planning system 202, the user input device 214, and the display device 216 may be incorporated into a single hand-held device as indicated by dashed box 222.

Figure 5A:
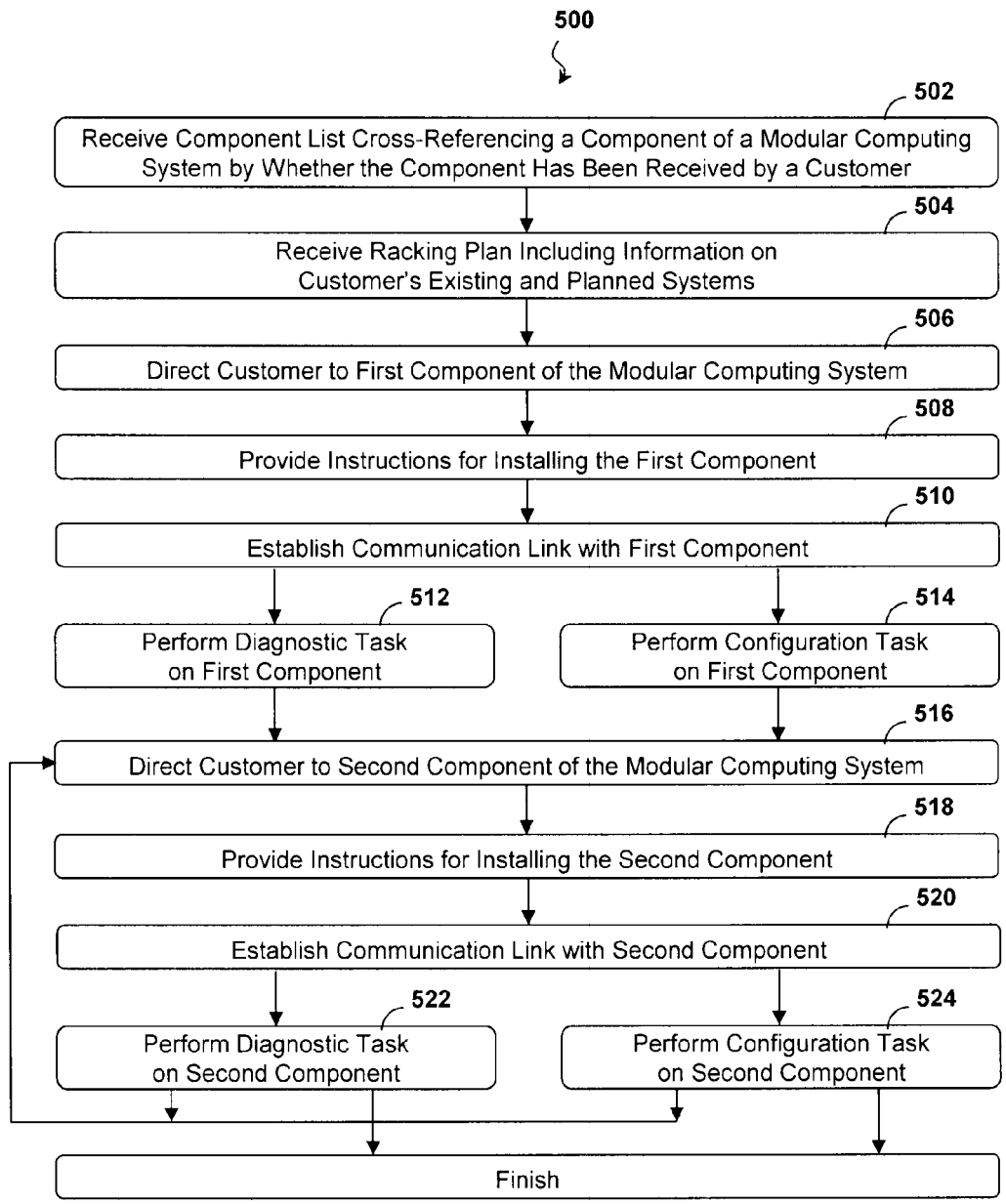
FIG. 5A is a flow diagram of a method of deploying the modular computing system according to aspects of the present disclosure.

FIG. 5A is a flow diagram of the method 500 of deploying the modular computing system 100 according to aspects of the present disclosure. It is understood that additional steps can be provided before, during, and after the steps of method 500, and that some of the steps described can be replaced or eliminated for other embodiments of the method. The method 500 is suitable for performing using a tracking and planning system 202 such as that disclosed with reference to FIGS. 2-4.

Referring to FIG. 4 and to block 502 of FIG. 5A, the tracking and planning system 202 may receive a component list 204 substantially similar to the component list 204 disclosed with respect to FIGS. 2 and 3. The component list 204 may be used to guide the customer in deploying (i.e., assembling, booting, configuring, and/or otherwise readying the system) the modular computing system 100. Accordingly, in various embodiments, the component list 204 includes information pertaining to the modular computing system 100 including a list of components of the system 100 cross-referenced by whether the components have been received by the customer. In some embodiments, the receiving of the component list 204 and the cross-referencing proceeds substantially as disclosed in blocks 302-324 of FIG. 3.

Referring to block 504, the tracking and planning system receives a racking plan 208, a data file that, as disclosed in detail below, records a customer's existing and planned systems, modules, and/or components. In some embodiments, the racking plan 208 includes a map or other representation of the customer's enclosure space (e.g., space within a rack, blade, or other enclosure) listing components installed in each area of the enclosure. The racking plan 208 may be used by the tracking and planning system 202 to determine where to install components during the deployment of the modular computing system 100. In so doing, the tracking and planning system 202 may consider proximity to other components, power availability, thermal considerations, weight limits, weight distribution and enclosure stability, routing channels, rack-to-rack connectivity, how a component is accessed for service, and/or other relevant factors. In some embodiments, the tracking and planning system 202 determines where to install components based on a fault-domain plan.

Referring to block 506, the tracking and planning system 202 directs the customer to a primary component 402 of the modular computing system 100. In many embodiments, the primary component 402 is the first component installed in the enclosure and is used to install subsequent components. Accordingly, a component may be designated as the primary component 402 because it includes a processing resource operable to configure subsequent components. A component may also be designated as the primary component 402 because it includes a processing resource operable to verify the deployment and operation of the subsequent components. For example, the primary component 402 may include a storage controller module and/or a processing module operable to verify the proper deployment of other modules and to configure the other modules. Additionally or in the alternative, the primary component 402 may also be characterized by having a power-providing resource such as a power supply.

In order to help the customer locate the primary component 402, the tracking and planning system 202 may provide the customer with information about the container 216 the primary component 402 was shipped in. This helps the customer to unbox and install the components of the modular computing system 100 in an orderly fashion. To do so, the tracking and planning system 202 queries the component list 204 and/or shipping manifest 206 to determine the respective shipping container 216 and container information. In some embodiments, the tracking and planning system 202 provides the information about the shipping container to the customer via a display device 220.

The information may correspond to a container information contained within a component list 204 or a shipping manifest 206 as disclosed with reference to FIG. 3. However, the provided information need not include the actual container identifier 214 stamped on the container 216. For example, whereas the container identifier 214 may take any human-readable or machine-readable form (e.g., a sequence of letters and/or numbers, a linear code, a matrix code, an RFID value, other suitable identifying code, etc.), a machine-readable format such as a matrix code may not be easily recognized by a customer. Therefore, the information provided by the tracking and planning system 202 may be tailored for the convenience of the customer. In one such embodiment, the container identifier 214 is a matrix code, whereas the tracking and planning system 202 instructs the customer to locate a box labeled "Fibre Attached Storage Controller Module." In another such embodiment, the container identifier 214 includes an RFID value, but the tracking and planning system 202 directs the customer to locate a package with a green circle. In yet another such embodiment, tracking and planning system 202 indicates the correct container by annotating an image or video taken of the container. Accordingly, the tracking and planning system 202 may include a digital imaging device for obtaining the image or video.

To further assist the customer in locating a container, in an embodiment, the tracking and planning system 202 interfaces with a customer's system for inventory monitoring to determine where the container has been stored within the customer's premises. The tracking and planning system 202 can then present the location of the container to the user.

In some embodiments, in addition to directing the customer to a particular container, the tracking and planning system 202 helps the customer identify components within the container. Many components, such as cables, are difficult to distinguish from one another. Therefore, the tracking and planning system 202 may provide instructions to help the customer recognize the component. In one such embodiment, the tracking and planning system 202 displays a graphical representation of the component at the display device 220 to illustrate a distinguishing characteristic.

Referring to block 508, once the primary component 402 is located, the tracking and planning system 202 may provide installation instructions at the display device 220. The installation instructions may guide the customer through physical installation, power-on, boot, configuration, and other deployment steps. For example, instructions may be provided regarding device mating, application discovery and software usage, power connections, communication connections, rack to rack interconnects, SFP (small form-factor pluggable transceiver)/QFP usage, cable routing, selection of ports, component placement, power on sequencing, and/or other suitable instructions. For clarity and customer understanding, in various embodiments, the tracking and planning system 202 presents instructions that include textual directions, illustrations, pictures, video, animation, and/or other suitable information types. In some embodiments, tracking and planning system 202 provides instructions by annotating an image or video. Accordingly, the tracking and planning system 202 may include a digital imaging device for obtaining the image or video to be annotated. The tracking and planning system 202 may integrate the presented instructions with customer prompts and other interactive events. For example, the customer may be prompted to enter configuration data such as networking information.

There are several advantages to utilizing a tracking and planning system 202 to provide installation instructions. Unlike paper instructions, the instructions provided by the tracking and planning system 202 can be customized to reflect the customer's evolving system. For example, enclosure locations, cabling diagrams, power distribution, cooling configuration, rack-to-rack distance, cool/hot aisle placement relative to the enclosure, service spacing, and other aspects of the installation may vary based on the particular components being deployed as well as on the customer's existing infrastructure. Accordingly, in some embodiments, the tracking and planning system 202 presents instructions tailored to the customer's unique environment. In some such embodiments, the tracking and planning system 202 analyzes the component list 204 and/or racking plan 208 and modifies the instructions to the client based on aspects of the modular computing system 100 being deployed, other systems being deployed within the same enclosure, other systems being deployed separately, systems and resources already in use, future systems and upgrades, and/or other relevant factors.

Other advantages include improved flexibility, usefulness, and clarity as well as reduced cost. In that regard, the instructions provided by the tracking and planning system 202 can be quickly updated. In some embodiments, the tracking and planning system 202 is updated immediately prior to deploying the modular computing system 100. The instructions provided by a tracking and planning system 202 may also be better indexed than a hardcopy version and may support electronic searching. The tracking and planning system 202 may also provide information in ways that printed instructions simply cannot, such as using animated images. For example, in one embodiment, the tracking and planning system 202 receives a digital image of the modular computing system 100 in its current state and annotates the image to emphasize a cable, a connection, a port, or other structure relevant to the current install step. The annotated image is then provided to the customer via the display device 220. Furthermore, the cost to deliver instruction electronically may be significantly less than printed alternatives particularly when the tracking and planning system 202 includes some of the customer's existing hardware.

Referring to block 510, once the primary component 402 has been installed and booted, the tracking and planning system 202 may establish a communication link with the primary component 402. The communication link may include a wired or wireless connection. Suitable wired connections include, but are not limited to, Ethernet, USB, IEEE 1394, and/or other serial or parallel connection. In an embodiment, the tracking and planning system 202 provides information to the customer via the display device 220 to help locate and recognize a suitable wired connector. Suitable wireless connections include, but are not limited to, Bluetooth, Wi-Fi/IEEE 802.11, and/or other suitable wireless connections.

Once the communication link is established, the tracking and planning system 202 may perform one or more deployment tasks on the primary component using the communication link. Referring to block 512, the tracking and planning system 202 performs a diagnostic procedure on the primary component 402. This may include reporting on the health of the primary component 402 as well as the health of connected components and may entail the exchange of diagnostic and report data between the tracking and planning system 202 and the primary component 402 over the communication link. In some embodiments where the customer manually performs a portion of the diagnostic procedure, the tracking and planning system 202 provides instructions to the customer on how to do so.

Referring to block 514, the tracking and planning system 202 may perform one or more configuration tasks on the primary component 402. For example, the tracking and planning system 202 may provide the primary component 402 with settings affecting network setup, storage provisioning, user accounts, and/or other settings by exchanging data over the communication link. The tracking and planning system 202 may also determine whether a software or firmware update is needed and may provide the needed update directly or provide a bridged connection to an external network where the update can be downloaded. These configuration tasks may be performed before, during, and/or after the diagnostic process of block 512.

After installing primary component 402, the tracking and planning system 202 may assist the user in installing one or more secondary components 404 of the modular computing system 100. Referring to block 516, the tracking and planning system 202 may provide instructions on locating and identifying the container the secondary component 404 was shipped in substantially as disclosed in block 506. The tracking and planning system 202 may also provide instructions that help the customer distinguish and identify components within the package. Referring to block 518, the tracking and planning system 202 may provide instructions for installing the secondary component 404 substantially as disclosed in block 508. In an exemplary embodiment, the instructions for installing the secondary component 404 include instructions for communicatively coupling the primary component 402 and the secondary component 404.

Referring to block 520, the tracking and planning system 202 may establish a communication link with the secondary component 404 being installed. In some embodiments, the tracking and planning system 202 establishes a direct wired or wireless connection with the secondary component 404 in a manner substantially similar that disclosed in block 510. In alternate embodiments, the primary component 402 acts as an intermediary. In such embodiments, the tracking and planning system 202 uses the previously established connection to communicate with the primary component 402, and the primary component 402 relays the communication to the secondary component 404. Referring to blocks 522 and 524, a diagnostic procedure and/or a configuration task may be performed on the secondary component 404 substantially as disclosed in blocks 512 and 514, respectively. The processes of blocks 516-524 may be repeated as often as needed to install the secondary components of the modular computing system 100.

Referring now to FIG. 5B, illustrated is a flow diagram of a method 550 of monitoring the deployment of the modular computing system 100 according to aspects of the present disclosure. It is understood that additional steps can be provided before, during, and after the steps of method 550, and that some of the steps described can be replaced or eliminated for other embodiments of the method. The method 550 is suitable for performing using a tracking and planning system 202 such as that disclosed with reference to FIGS. 2-4 and 5A.

Concurrent with the deployment of method 500, the tracking and planning system 202 may repeatedly validate that the install is proceeding correctly as illustrated in block 552. This may include receiving diagnostic information provided during the diagnostic tasks of block 512 and 522 and may also include one or more separate validation processes. In some embodiments, the tracking and planning system 202 performs an operability check between the primary component 402 and the secondary component 404 as well as between multiple secondary components 404. The operability check may verify communication between components as well as functional capabilities. In further embodiments, the tracking and planning system 202 verifies device types, the number of devices, communications connections, power connections, thermal conditions, the level of redundancy, and/or other aspects of the modular computing system 100. Performing this validation during the installation of the primary component 402 and the secondary component(s) 404 detects installation errors sooner than waiting until the modular computing system 100 is fully deployed. Earlier detection may make correcting installation errors simpler and more efficient. Accordingly, in a particular embodiment, validation is performed after each connection is made to determine whether the connection was made correctly.

Referring to block 554 of FIG. 5B, for some installation errors, the tracking and planning system 202 provides information that assists the customer in correcting the error. For example, the tracking and planning system 202 may determine an incorrect connection between the primary component 402 and a secondary component 404 and may provide instructions on correcting the connection. In an embodiment, the tracking and planning system 202 provides a wiring diagram with an incorrect connection highlighted for visibility. In a further embodiment, the tracking and planning system 202 receives a digital image of the modular computing system 100 in its current state and annotates the image to emphasize an incorrectly installed component. The annotated image is then provided to at the display device 220.

Referring to FIG. 4 and to block 556 of FIG. 5B, for some installation errors, particularly those too complicated for the customer to resolve, the tracking and planning system 202 creates a technical support report 406. The technical support report may include successes and/or failures recorded during a diagnostic or validation process, serial numbers and other registration information, and other relevant technical support information. Referring to block 558, the tracking and planning system 202 provides the technical support report 406 to a third-party computing system 210.

FIG. 6A is a flow diagram of a method 600 of managing the deployment of the modular computing system 100 according to aspects of the present disclosure. It is understood that additional steps can be provided before, during, and after the steps of method 600, and that some of the steps described can be replaced or eliminated for other embodiments of the method. The method 600 is suitable for performing using a third-party system 210 and a tracking and planning system 202 such as those disclosed with reference to FIGS. 2-5B.

Despite rapid advances in portable computing devices, in some embodiments, it may prove advantageous to offload some processing and data management to a central server. Centralizing these operations may reduce the burden on the tracking and planning system 202 and the cost to the consumer. Accordingly, in various embodiments, the computing resources of the third-party system 210 perform some or all of the tasks ascribed to the tracking and planning system 202.

Referring to block 602 of FIG. 6A, the third-party system 210, which may belong to a shipper, manufacturer, reseller, sales facility, installer, or other entity, maintains a component list 204 recording a component of a modular computing resource. The components of the component list 204 may include customer purchases as well as component the customer currently has on hand, components ordered but not yet received, and/or components identified for future purchase. Possible components include any tangible or intangible consumer goods and services. In some embodiments, maintaining the component list 204 may include providing the component list to another computing resource such as a tracking and planning system 202.

Referring to block 604, a shipping manifest 206 is maintained by the third-party system 210. The shipping manifest 206 contains shipping information for components including those of the component list 204. The shipping manifest 206 may cross-reference the components to one or more container identifiers. In some embodiments, maintaining the shipping manifest 206 may include providing the shipping manifest to another computing resource such as a tracking and planning system 202.

Referring to block 606, the third-party system 210 may receive a container identifier 214 corresponding to one of the one or more received shipping container 216. In some exemplary embodiments, the third-party system 210 receives a container identifier 214 from a tracking and planning system 202 obtained by scanning a container using an ID reader 212. In one such embodiment, the third-party system 210 receives a digital image from the tracking and planning system 202 and performs an optical pattern recognition process on the image to determine a container identifier 214 from the digital image.

Referring to block 608, the third-party system 210 queries the shipping manifest 206 based on the container identifier to determine the component or components within the identified container 216. Thus using the container identifier, the third-party system 210 determines those components that the customer has received without requiring the customer to unpack and inventory the contents. Once the components have been identified, the third-party system 210 may also record that the components have been received. In one such embodiment, the third-party system 210 updates the component list 204 to indicate that the respective components have been received and to include the respective container identifier 214.

Referring to block 610, the third-party system 210 queries the component list 204 to determine whether all the components of a modular computing system 100 have been received. If so, in block 612, the third-party system 210 provides the customer with an appropriate indication that the components have been received and/or that the system 100 is ready for deployment. This may include providing the indication to the tracking and planning system 202 for display at a display device 220. The indication may include a list of the components, dates components were received, respective container identifiers for the components, and/or other suitable user information. In some embodiments, the component list 204 corresponds to more than one modular computing system 100. In such embodiments, the third-party system 210 may determine whether the components of at least one of the modular computing system 100 has been received and if so, provides the appropriate indication. After providing the indication that all the component have been received, the third-party system 210 may then proceed to assist the customer in deploying the modular computing system 100 as disclosed in block 614 and FIG. 6B.

If the analysis of the component list 204 in block 610 determines that some but not all of the components of a modular computing system 100 have been received, the method 600 proceeds to block 616. In block 616, the third-party system 210 determines from the component list 204 whether an incremental deployment of the modular computing system 100 is possible based on the components that have been received. An incremental deployment brings a portion of the modular computing system 100 on-line with the expectation that further portions of the system 100 will be deployed later. In the interim, the incrementally deployed system 100 may provide reduced functionality (e.g., reduced computing, storage, and/or network capacity) but not necessarily, and in many embodiments, an incrementally deployed system 100 suffers no performance impact.

In order to determine whether an incremental deployment is possible, the third-party system 210 may consider any relevant factor. In some embodiments, the considerations include determining whether the received components have sufficient computing resources (e.g., processing, storage, communication, cooling resources, power resources, etc.) to meet a minimum requirement to deploy a modular computing system 100. For example, if no power supply has been received, a deployment may not be possible. In a further embodiment, the third-party system 210 determines whether at least one processing resource, at least one storage resource, at least one communication resource, and at least one power resource has been received by the customer. If so, an incremental deployment may be possible. As another example, the determination of whether an incremental deployment is possible may include evaluating available enclosure space (e.g., space within a rack or blade enclosure).

In some embodiments, determining whether an incremental deployment is possible includes assessing the process required for adding additional components to the incrementally deployed modular computing system 100 and thereby deploying the remainder. In various embodiments, the third-party system 210 considers wiring changes, racking changes, hardware and software configuration changes, power distribution changes, cooling changes, and/or other modifications the customer will be expected to perform when the remaining components are received. The third-party system 210 may determine a difficulty assessment and/or an estimated time needed to implement the initial (incremental) deployment and/or to subsequently deploy the remainder and upgrade the incremental deployment to full operating status. In some embodiments, the third-party system 210 compares the components that have not yet arrived against a list of commonly-available components obtained from the component list 204 and/or the tracking and planning system 202.

If it is determined in block 616 that an incremental deployment is not possible, in block 618, the third-party system 210 may provide the customer an indication that some of the components have not been received and that the modular computing system 100 is not ready to be deployed. This may include providing the indication to the tracking and planning system 202 for display at a display device 220. The indication may include a list of all components, a list of components that have not been received, an expected date of arrival for a component that has not been received, a date a received component was received, a respective container identifier for a received component, and/or other suitable information. The third-party system 210 may then return to block 606 and await the receipt of further shipping container identifiers 214.

If it is determined in block 616 that an incremental deployment is possible, in block 620, the third-party system 210 provides an appropriate indication to the customer. This may include providing the indication to the tracking and planning system 202 for display at a display device 220. In some embodiments, the third-party system 210 provides a list of the components, a list of components that have not been received, an expected date of arrival for a component that has not been received, a date a received component was received, a respective container identifier for a received component, and/or other suitable user information. The third-party system 210 may also provide information pertaining to the potential incremental deployment such an amount or percentage of functionality the incrementally deployed system can provide, a difficulty in upgrading the system as additional components arrive, an estimated time to upgrade the system as additional components arrive, commonly-available components the customer may have on hand, and other relevant details.

If customer does not wish to perform an incremental deployment, the third-party system 210 may return to block 606 to await receipt of subsequent container identifiers 214. In some embodiments, the third-party system 210 interprets the subsequent receipt of another container identifier as an indication that the customer is still scanning containers and does not wish to assemble an incrementally-deployed system at this time.

Figure 6B:
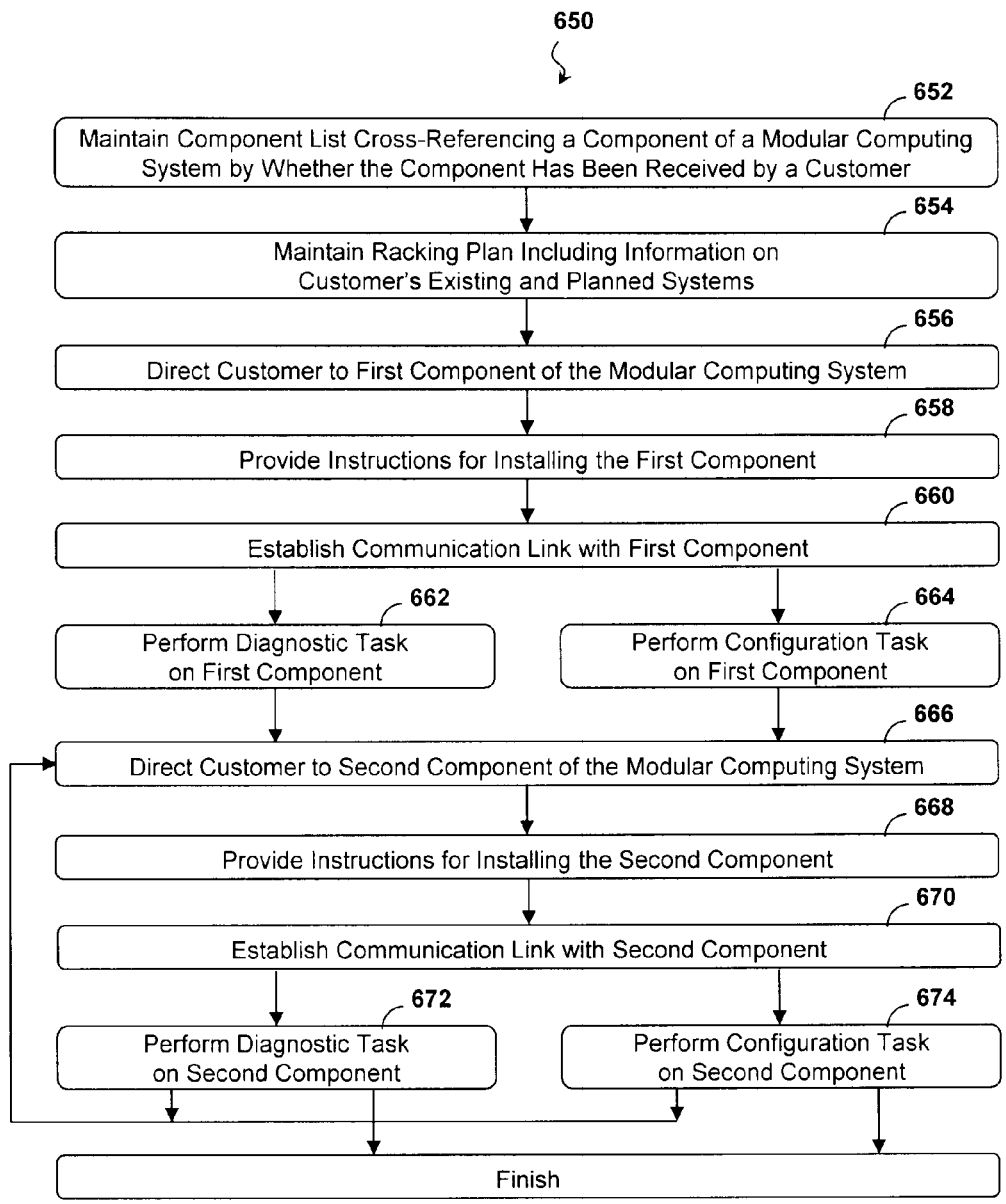

On the other hand, if the customer is ready to proceed with an incremental deployment, the method 600 may proceed to block 622 where the third-party system 210 assists the customer in assembling, configuring, booting, and bringing the incrementally-deployed modular computing system 100 into service as disclosed with respect to FIG. 6B.

Just as the third-party system 210 may perform some or all of the tracking tasks on behalf of the tracking and planning system, when the components are available to assemble a modular computing system 100, either in whole or in part, the third-party system 210 may provide detailed steps guiding the customer through the deployment. FIG. 6B is a flow diagram of a method 650 of managing the deployment of the modular computing system 100 according to aspects of the present disclosure. It is understood that additional steps can be provided before, during, and after the steps of method 650, and that some of the steps described can be replaced or eliminated for other embodiments of the method. The method 650 is suitable for performing using a third-party system 210 and a tracking and planning system 202 such as those disclosed with reference to FIGS. 2-6A.

Referring to block 652 of FIG. 6B, the third-party system 210 may maintain a component list 204 substantially similar to the component list 204 disclosed with respect to FIGS. 2 and 3. In some embodiments, maintaining the component list 204 includes providing the component list to another computing resource such as a tracking and planning system 202. The component list 204 may be used to guide the customer in deploying (i.e., assembling, booting, configuring, and/or otherwise readying the system) the modular computing system 100. Accordingly, in various embodiments, the component list 204 includes information pertaining to the modular computing system 100 including a list of components of the system 100 cross-referenced by whether the components have been received by the customer. In some embodiments, the maintaining of the component list 204 and the cross-referencing proceeds substantially as disclosed in blocks 602-622 of FIG. 6A.

Referring to block 654, the third-party system 210 may maintain a racking plan 208, a data file that, as disclosed in detail below, records a customer's existing and planned systems, modules, and/or components. Maintaining the racking plan 208 may include providing the racking plan to another computing resource such as a tracking and planning system 202. In some embodiments, the racking plan 208 includes a map or other representation of the customer's enclosure space (e.g., space within a rack, blade, or other enclosure) listing components installed in each area of the enclosure. The racking plan 208 may be used to determine where to install components during the deployment of the modular computing system 100. In so doing, the third-party system 210 may consider proximity to other components, power availability, thermal considerations, weight limits, weight distribution and enclosure stability, routing channels, rack-to-rack connectivity, how a component is accessed for service, and/or other relevant factors. In some embodiments, the third-party system 210 determines where to install components based on a fault-domain plan.

Referring to block 656, the third-party system 210 directs the customer to a primary component 402 of the modular computing system 100. In many embodiments, the primary component 402 is the first component installed in the enclosure and is used to install subsequent components. In various embodiments, a component may be designated as the primary component 402 based on it including: a processing resource operable to configure subsequent components; a processing resource operable to verify the deployment and operation of the subsequent components; a storage controller module; a processing module operable to verify the proper deployment of other modules or to configure the other modules; and/or a power-providing resource.

In order to help the customer locate the primary component 402, the third-party system 210 may provide the customer with information about the container 216 the primary component 402 was shipped in. This helps the customer to unbox and install the components of the modular computing system 100 in an orderly fashion. To do so, the third-party system 210 queries the component list 204 and/or shipping manifest 206 to determine the respective shipping container 216 and container information. In some embodiments, the third-party system 210 provides the customer information to a tracking and planning system 202 for display to the customer via a display device 220. The provided information may be tailored for the convenience of the customer and may include images, animation, video, and other media. For example, in one such embodiment, third-party system 210 indicates the correct container by annotating an image or video taken of the container. Accordingly, the third-party system 210 may receive the image or video to be annotated from a tracking and planning system 202 or other image-capture system.

To further assist the customer in locating a container, in an embodiment, the third-party system 210 interfaces with a customer's system for inventory monitoring to determine where the container has been stored within the customer's premises. The third-party system 210 can then present the location of the container to the customer.

Referring to block 658, once the primary component 402 is located, the third-party system 210 may provide installation instructions. The installation instructions guide the customer through physical installation, power-on, boot, configuration, and/or other deployment steps. For example, instructions may be provided regarding device mating, application discovery and software usage, power connections, communication connections, rack to rack interconnects, SFP (small form-factor pluggable transceiver)/QFP usage, cable routing, selection of ports, component placement, power on sequencing, and/or other suitable instructions. For clarity and customer understanding, in various embodiments, the third-party system 210 presents instructions that include textual directions, illustrations, pictures, video, animation, and/or other suitable information types. Accordingly, the third-party system 210 may receive an image or video to be annotated from a tracking and planning system 202 or other image-capture system. The third-party system 210 may integrate the presented instructions with customer prompts and other interactive events. For example, the customer may be prompted to enter configuration data such as networking information. In some embodiments, the instructions are provided to a tracking and planning system 202 or other computing resource for presentation to the customer.

Referring to block 660, once the primary component 402 has been installed and booted, the third-party system 210 may establish a communication link with the primary component 402. The communication link may include a wired or wireless connection. Suitable wired connections include, but are not limited to, Ethernet, USB, IEEE 1394, and/or other serial or parallel connection. In an embodiment, the third-party system 210 provides information to the customer to help locate and recognize a suitable wired connector. Suitable wireless connections include, but are not limited to, Bluetooth, Wi-Fi/IEEE 802.11, and/or other suitable wireless connections. In some embodiments, the third-party system 210 establishes the communication link via a tracking and planning system 202 acting as a relay.

Once the communication link is established, the third-party system 210 may perform one or more deployment tasks on the primary component using the communication link. Referring to block 662, the third-party system 210 performs a diagnostic procedure on the primary component 402. This may include reporting on the health of the primary component 402 as well as the health of connected components and may entail the exchange of diagnostic and report data between the third-party system 210 and the primary component 402 over the communication link. In some embodiments where the customer manually performs a portion of the diagnostic procedure, the third-party system 210 provides instructions to the customer on how to do so.

Referring to block 664, the third-party system 210 may perform one or more configuration tasks on the primary component 402. For example, the third-party system 210 may provide the primary component 402 with settings affecting network setup, storage provisioning, user accounts, and/or other settings by exchanging data over the communication link. The third-party system 210 may also determine whether a software or firmware update is needed and may provide the needed update directly or provide a bridged connection to an external network where the update can be downloaded. These configuration tasks may be performed before, during, and/or after the diagnostic process of block 662.

After installing primary component 402, the third-party system 210 may assist the user in installing one or more secondary components 404 of the modular computing system 100. Referring to block 666, the third-party system 210 may provide instructions on locating and identifying the container the secondary component 404 was shipped in substantially as disclosed in block 656. The third-party system 210 may also provide instructions that help the customer distinguish and identify components within the package. Referring to block 668, the third-party system 210 may provide instructions for installing the secondary component 404 substantially as disclosed in block 658. In an exemplary embodiment, the instructions for installing the secondary component 404 include instructions for communicatively coupling the primary component 402 and the secondary component 404.

Referring to block 670, the third-party system 210 may establish a communication link with the secondary component 404 being installed. In some embodiments, the tracking and planning system 202 establishes a direct wired or wireless connection with the secondary component 404 in a manner substantially similar that disclosed in block 660. In alternate embodiments, the primary component 402 acts as an intermediary. In such embodiments, the third-party system 210 uses the previously established connection to communicate with the primary component 402, and the primary component 402 relays the communication to the secondary component 404. Referring to blocks 672 and 674, a diagnostic procedure and/or a configuration task may be performed on the secondary component 404 substantially as disclosed in blocks 662 and 664, respectively. The processes of blocks 666-674 may be repeated as often as needed to install the secondary components of the modular computing system 100.

Figure 7:
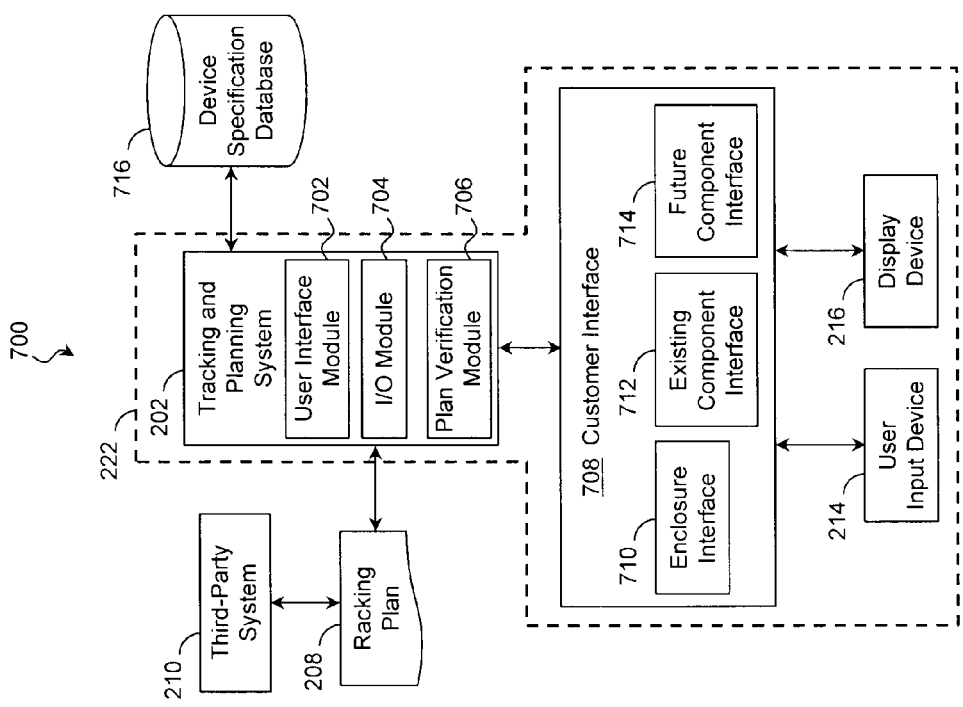
FIG. 7 is a schematic diagram of a computing infrastructure for system planning according to aspects of the present disclosure.

At any time during the planning, purchase, installation, or operation of a computing system, the customer may find it useful to take account of the customer's existing infrastructure and to use that information to plan for future expansions. Therefore, the tracking and planning system 202 may provide a mechanism for blueprinting existing and future systems using the aforementioned racking plan 208. A method and system for system planning are disclosed with reference to FIGS. 7 and 8. FIG. 7 is a schematic diagram of a computing infrastructure 700 for system planning according to aspects of the present disclosure. The computing infrastructure 700 includes a tracking and planning system 202, a racking plan 208, a user input device 218, a display device 220, and a third-party system 210, each substantially similar to those disclosed with reference to FIGS. 2-6B. In that regard, the tracking and planning system 202, the user input device 214 and the display device 216 may be incorporated into a single hand-held device as indicated by dashed box 222. The tracking and planning system 202 includes a user interface module 702 operable to present a customer interface for system planning, an I/O module 704 operable to receive user input, and a plan verification module 706 operable to ensure that a plan meets certain design criteria. The operation of each is disclosed in further detail below.

Figure 8:
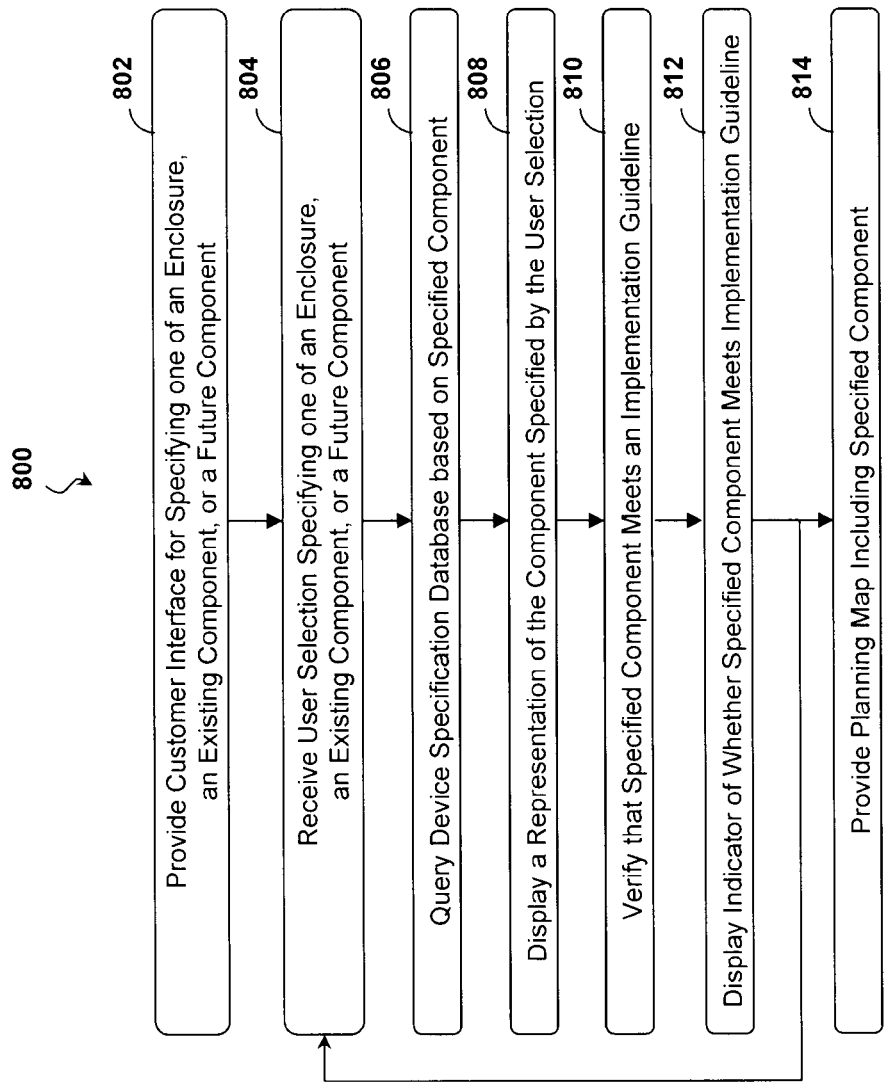
FIG. 8 is a flow diagram of the method of planning for future modifications to a modular computing system according to aspects of the present disclosure.

FIG. 8 is a flow diagram of the method 800 of planning for future modifications to a modular computing system 100 according to aspects of the present disclosure. It is understood that additional steps can be provided before, during, and after the steps of method 800 and that some of the steps described can be replaced or eliminated for other embodiments of the method. The method 800 is suitable for performing using a tracking and planning system 202 such as that disclosed with reference to FIGS. 2-7.

The tracking and planning system 202 provides a customer interface that allows a customer to specify the components already in service and to explore options for deploying future components and systems. Referring to FIG. 7 and to block 802 of FIG. 8, the user interface module 102 of the tracking and planning system 202 provides the customer interface 708 at the display device 220. An exemplary customer interface 708 includes an enclosure interface 710, an existing component interface 712, and a future component interface 714. However, it is understood that these interfaces are merely exemplary and other constituent interfaces are both contemplated and provided for.

The enclosure interface 710 provides user-selectable objects or other mechanisms for a customer to provide information about current and/or future enclosures 104. As disclosed above, enclosures 104 may include rack enclosures, tower enclosures, blade enclosures, and/or other suitable devices used to house a modular computing system 100. In an embodiment, the enclosure interface 710 includes a palate of common enclosures 104. The enclosure interface 710 may also provide a user-selectable mechanism for a customer to specify an enclosure that is not listed in the palate. In various embodiments, the customer may specify the enclosure by name, model, and/or other identifier and may provide details in lieu of specifying a particular enclosure. The enclosure interface 710 may also provide a mechanism for the customer to provide installation information about the enclosure such as distance between enclosures, power and cooling available to an enclosure, ambient temperature, weight distribution, serviceability, and/or other suitable information.

The existing component interface 712 provides user-selectable objects and/or other mechanisms for the customer to provide information about components currently installed in an enclosure 104. The existing component interface 712 may include representations of common components and may allow a customer to specify alternate components by name, by model, by other identifier, or by providing component information directly. In an embodiment, the existing component interface 712 allows customers to drag and drop icons representing components onto a graphical representation of an enclosure in order to specify how components are currently installed.

In some embodiments, the existing component interface 712 provides a user-selectable object for manipulating a routing or cabling diagram. A cabling diagram allows customers to specify connection-based components such as wired or wireless communicative couplings, power couplings, and/or thermal couplings connections between components and between systems.

The future component interface 714 provides user-selectable objects or other mechanisms for the customer to add, modify, and otherwise manipulate components to be added to the enclosure at a later time. The future component interface 714 may include representations of common components and may allow a customer to specify alternate components by name, by model, by other identifier, or by providing component information directly. In an embodiment, the future component interface 714 allows customers to drag and drop icons representing components onto a graphical representation of an enclosure in order to specify how components are currently installed. As with the existing component interface 712, the future component interface 714 may provide a user-selectable object for manipulating a routing or cabling diagram.

Referring to FIG. 7 and to block 804 of FIG. 8, the I/O module 704 of the tracking and planning system 202 receives a user selection via the user input device 218. The user selection may specify an existing or future component (including both enclosures and components installed therein) and/or a property thereof. As the user selection may not include all relevant information, referring to block 806, the tracking and planning system 202 may search a device specification database 716 for further planning information for a given component, particular when the customer specifies an alternate component not directly provided by the customer interface 708. In that regard, the device specification database 716 communicatively coupled to the tracking and planning system 202 may contain technical information relating to a number of enclosures, modules, and/or other components.

Referring to block 808, the user interface module 702 displays a representation, such as an icon or other visual representation, of the selected component at the display device 216. In an embodiment, representation illustrates an aspect of the installation configuration (e.g., install location, connections to other components, etc.). For clarity, the representation may be presented in context, illustrating a relationship between component and other components of the modular computing system 100. The user interface module 702 may also provide information regarding expected performance of the modular computing system 100 and information regarding potential for future expansion.

Referring to block 810, the plan verification module 706 verifies that an aspect of a selected enclosure, module, and/or other component meets one or more implementation guidelines. Implementation guidelines may include space requirements, cabling requirements, cable length requirements, weight requirements, thermal requirements, power requirements, serviceability, and/or other requirements designed to ensure the integrity of a modular computing system 100.

Referring to block 812, the user interface module 702 displays an indicator of whether the selected component meets the implementation guideline. In some embodiments, this includes advising the customer on valid configurations. For example, the user interface module 702 may present a recommended installation configuration on the customer interface 708 that meets the guideline or may highlight installation configurations that do not meet the guideline.

The process of blocks 804-812 may be repeated in order to specify additional components. With each iteration, verification process of block 810 considers the currently selected component in the context of the previously-specified components when determining whether the implementation guideline is met. By specifying, displaying, and verifying subsequent components in the context of the previously-specified components, a clear picture of the customer's computing environment emerges.

The customer can also use the process of blocks 804-812 to examine different scenarios and to develop an overall system plan. To assist the customer in scenario planning, the user interface module 702 may provide information regarding expected performance, expected cost to deploy, expected cost to operate, and/or the potential for future expansion.

Referring to block 814, the tracking and planning system 202 may create a racking plan 208 that captures and records this computing environment including the specified existing and planned systems, modules, and/or other components. This racking plan may be substantially similar in structure to the racking plan 208 disclosed above. The racking plan 208 may be used by the customer for future planning purposes and may be provided to a third-party system 210 for use in placing an order or to obtain sales or technical support.

Figure 9:
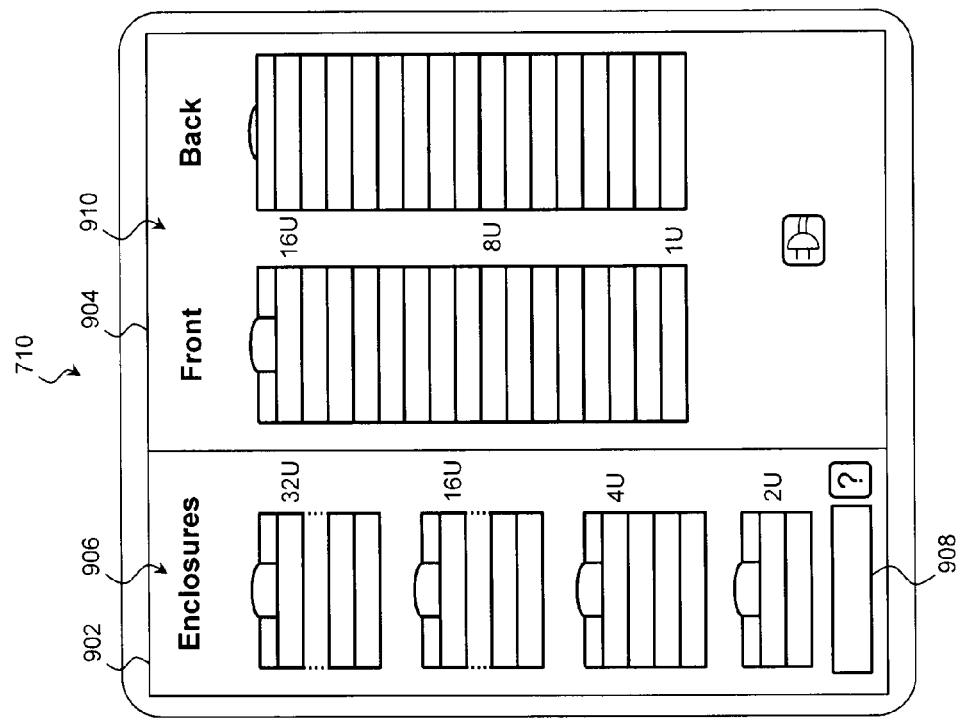
FIG. 9 is a diagram of an exemplary enclosure interface for specifying an enclosure of a modular computing system according to some aspects of the present disclosure.

FIG. 9 is a diagram of an exemplary enclosure interface 710 for specifying an enclosure 104 of a modular computing system 100 according to some aspects of the present disclosure. The enclosure interface 710 may be displayed on the display device 216 described with reference to FIG. 7. The enclosure interface 710 represents one possible arrangement for displaying the information presented by the tracking and planning system 202 and more specifically presented by the user interface module 702. One skilled in the art will recognize that alternate arrangements are both contemplated and provided for.

In the illustrated embodiment, the enclosure interface 710 includes a first and second display pane, 902 and 904, respectively. The first display pane 902 presents a set of user-selectable objects 906 operable to specify an enclosure and a user mechanism 908 for specifying an alternate enclosure by name, by model, by other identifier, or by providing enclosure information directly. In alternate embodiments, the objects 906 and the user mechanism 908 may take any other suitable form including checkboxes, exclusive and non-exclusive lists, radio buttons, and/or other suitable interface schemes. The second display pane 904 displays a representation 910 of a currently specified or previously specified enclosure.

Figure 10:
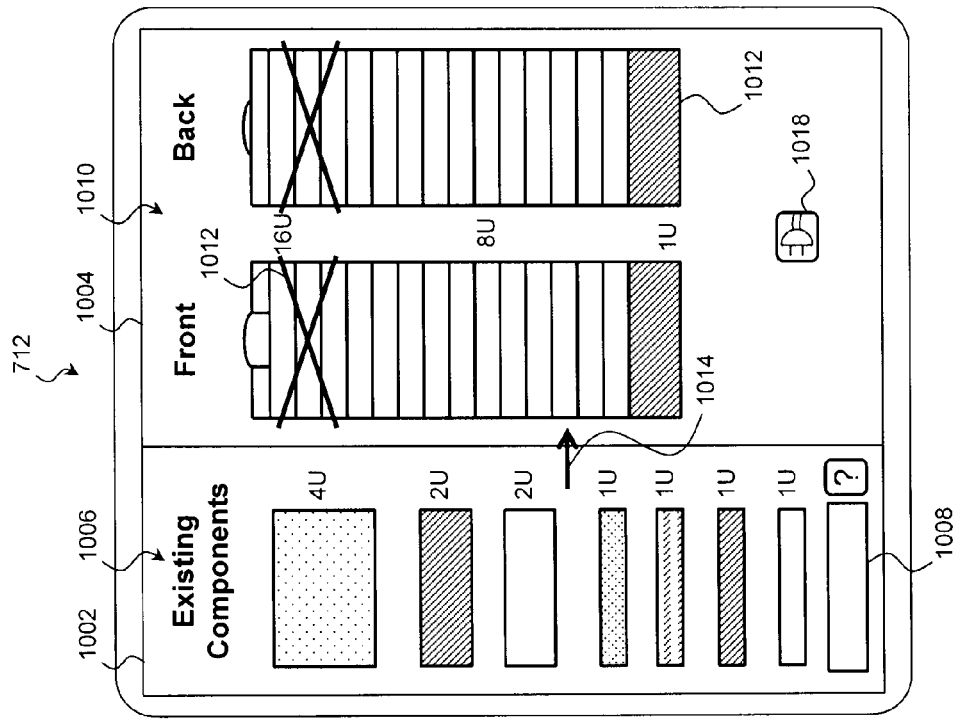
FIG. 10 is a diagram of an exemplary existing component interface for specifying components of a modular computing system according to some aspects of the present disclosure.

FIG. 10 is a diagram of an exemplary existing component interface 712 for specifying components of a modular computing system 100 according to some aspects of the present disclosure. The existing component interface 712 may be displayed on the display device 216 described with reference to FIG. 7. The existing component interface 712 represents one possible arrangement for displaying the information presented by the tracking and planning system 202 and more specifically presented by the user interface module 702. One skilled in the art will recognize that alternate arrangements are both contemplated and provided for.

In the illustrated embodiment, the existing component interface 712 includes a first and second display pane, 1002 and 1004, respectively. The first display pane 1002 presents a set of user-selectable objects 1006 operable to specify a component currently installed in an enclosure and a user mechanism 1008 for specifying an alternate component by name, by model, by other identifier, or by providing enclosure information directly. In alternate embodiments, the objects 1006 and the user mechanism 1008 may take any other suitable form including checkboxes, exclusive and non-exclusive lists, radio buttons, and/or other suitable interface schemes. The second display pane 1004 displays a representation 1010 of an enclosure including a representation 1012 of a currently specified or previously specified component installed within the enclosure. In some embodiments, the second display pane 1004 further displays one or more indicators 1014 and 1016 that assist a customer in selecting installation configurations that meet an implementation guideline. These include indicators 1014 of suggested installation configurations that meet the guideline and indicators 1016 of configurations that do not meet the guideline. Additionally, either the first or the second display pane may include a user-selectable object 1018 for manipulating a cabling diagram.

Figure 11:
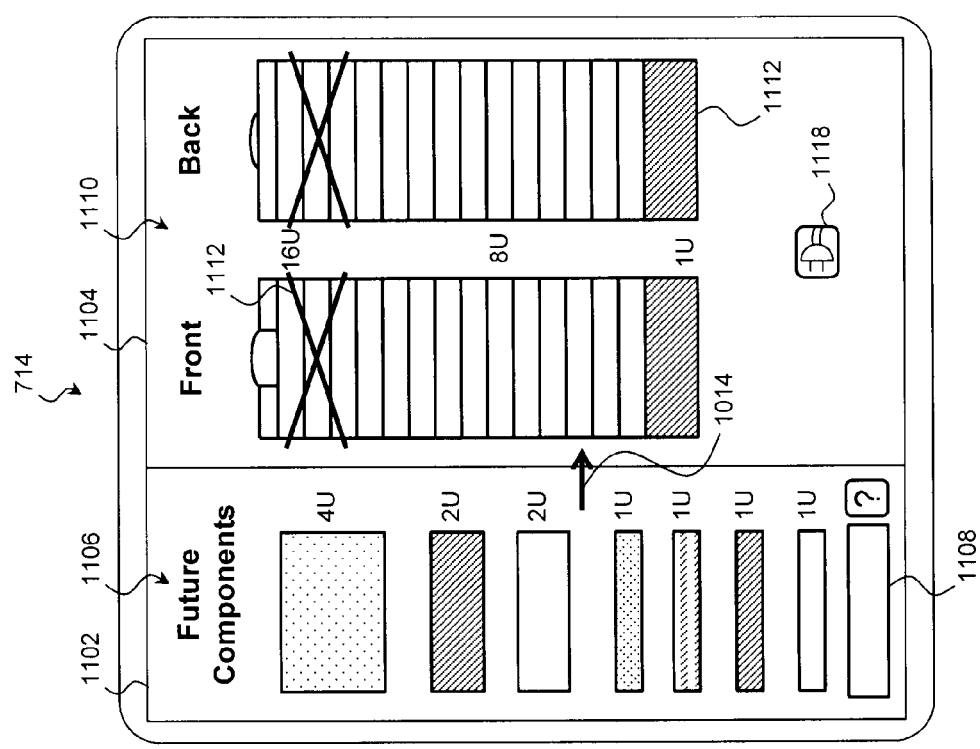
FIG. 11 is a diagram of an exemplary future component interface for specifying components of a modular computing system according to some aspects of the present disclosure.

FIG. 11 is a diagram of an exemplary future component interface 714 for specifying components of a modular computing system 100 according to some aspects of the present disclosure. The future component interface 714 may be displayed on the display device 216 described with reference to FIG. 7. The future component interface 714 represents one possible arrangement for displaying the information presented by the tracking and planning system 202 and more specifically presented by the user interface module 702. One skilled in the art will recognize that alternate arrangements are both contemplated and provided for.

In the illustrated embodiment, the future component interface 714 includes a first and second display pane, 1102 and 1104, respectively. The first display pane 1102 presents a set of user-selectable objects 1106 operable to specify a component to be installed in an enclosure and a user mechanism 1108 for specifying an alternate component by name, by model, by other identifier, or by providing enclosure information directly. In alternate embodiments, the objects 1106 and the user mechanism 1108 may take any other suitable form including checkboxes, exclusive and non-exclusive lists, radio buttons, and/or other suitable interface schemes. The second display pane 1104 displays a representation 1110 of an enclosure including a representation 1112 of a currently specified or previously specified component installed within the enclosure. In some embodiments, the second display pane 1104 further displays one or more indicators 1114 and 1116 that assist a customer in selecting installation configurations that meet an implementation guideline. These include indicators of suggested installation configurations 1114 and indicators of configurations that do not meet the implementation guideline. Additionally, either the first or the second display pane may include a user-selectable object 1118 for manipulating a cabling diagram.

Thus, the present disclosure provides a system and method for assisting a customer in planning, deploying, and verifying a modular computing system. In some embodiments, a method of tracking receipt of components of a modular computing system is provided. The method comprises: receiving a component list listing a component of the modular computing system; receiving a shipping manifest including shipping information corresponding to the component; reading a shipping container identifier of a received shipping container; determining, using a computing system, that the received shipping container contains the component and that the component has been received by a customer; and determining, based on the component having been received by the customer, whether the modular computing system can be deployed. In one such embodiment, the determining of whether the modular computing system can be deployed includes: determining whether all components of the modular computing system have been received by the customer; and determining whether the modular computing system can be incrementally deployed when it is determined that not all the components of the modular computing system have been received by the customer.

In further embodiments, a system for assessing the deployment of a modular computing resource is provided. The system comprises: a display device; a user input device; a shipping container identifier (ID) reader operable to recognize a container identifier; and a computing system communicatively coupled to the display device, the user input device, and the shipping container ID reader, wherein the computing system is operable to: receive a component list and a shipping manifest; receive, from the shipping container ID reader, a representation of the container identifier; determine, based on the representation of the container identifier, a component of a modular computing resource received by a customer; and determine, based on the component received by the customer, whether the modular computing resource can be deployed.

In yet further embodiments, an apparatus is provided comprising: a non-transitory, tangible computer readable storage medium storing a computer program, wherein the computer program has instructions that, when executed by a computer processor, carry out: querying a shipping manifest based on a shipping container identifier to determine a corresponding shipping container and a computing component contained therein; modifying a component list to indicate the computing component as received; determining, using a tracking computing system, based on the component list whether sufficient components have been received to deploy a modular computing system; and providing information regarding whether sufficient components have been received to deploy the modular computing system.

In yet further embodiments, a method for deploying a modular computing system is provided. The method is performed by an installation computing system and comprises: receiving a component list corresponding to the modular computing system; identifying a first component of the modular computing system from the component list; determining a first container identifier corresponding to a shipping container of the first component of the modular computing system; and providing, at a display device of the installation computing system, the first container identifier. In one such embodiment, the method further comprises: performing a diagnostic process on the first component by exchanging data over the communication link with the installation computing system; providing, at the display device, an instruction for installing a second component within the computing enclosure; and establishing a communication link with the second component via the first component.

In yet further embodiments, an apparatus is provided comprising: a non-transitory, tangible computer readable storage medium storing a computer program, wherein the computer program has instructions that, when executed by a computer processor, carry out: querying a component list of a modular computing system to determine a shipping container containing a primary component of the modular computing system; determining a container identifier for the shipping container; providing, at a display device, the container identifier; and providing, at the display device, a human-readable instruction for making the primary component operational.

In yet further embodiments, a system for providing installation assistance is provided. The system comprises: a display device; a user input device; a computing system including a processor and a non-transitory computer-readable storage medium operable to store instructions executable by the processor, wherein the computing system is operable to: determine, based on a component list for a modular computing system, a shipping container corresponding to a component of the modular computing system determine a container identifier for the shipping container; provide, at the display device, the container identifier; provide, at the display device, an instruction in a human-readable format for deploying the component; and diagnose an installation error of the component.

In yet further embodiments, a method for planning an implementation of a modular computing system is provided. The method comprises: presenting a user interface at a display device, the user interface including a plurality of user-selectable objects, each of the user-selectable objects representing a component of the modular computing system; receiving, via a user input device, a user selection from among the user-selectable objects specifying one of an enclosure, an existing component, and a future component of the modular computing system; displaying, at the display device, a representation of the specified one of an enclosure, an existing component, and a future component; verifying the user selection with respect to an implementation guideline; and displaying, at the display device, an indicator of whether the user selection meets the implementation guideline.

In yet further embodiments, a system for planning a computing infrastructure is provided, the system comprising: a user input device; a display device; and a planning system comprising: a user interface module operable to present an interface at the display device, the interface including a user-selectable object operable to select one of an enclosure, an existing component, and a future component of the computing infrastructure; an I/O module operable to receive, from the user input device, a user selection, based on the user-selectable object, of one of an enclosure, an existing component, and a future component; a verification module operable to verify the user selection based on an implementation guideline of the computing infrastructure.

In yet further embodiments, an apparatus is provided. The apparatus comprises: a non-transitory, tangible computer readable storage medium storing a computer program, wherein the computer program has instructions that, when executed by a computer processor, carry out: presenting, at a display device, a plurality of user-selectable objects, each of the user-selectable objects representing a component of a modular computing system; receiving a user selection corresponding to one of the plurality of user-selectable objects, wherein the user selection specifies a represented component as one of an enclosure, an existing component, and a future component of the modular computing system; presenting, at the display device, a second display region including a representation of the user selection; and presenting, at the display device, an indicator of whether the user selection meets an implementation guideline of the computing system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for planning an implementation of a modular computing system, the method comprising:
presenting a user interface at a display device, the user interface including a plurality of user-selectable objects, each of the user-selectable objects representing a component of the modular computing system that includes at least a computing module for performing computations, a communication module for communication, a storage device for storage, a power module for providing power and an input/output (I/O) module for receiving user input, wherein the presenting of the user interface includes: presenting a first interface operable to specify a computing enclosure, presenting a second interface operable to specify a currently-installed component within the computing enclosure, and presenting a third interface operable to specify a component to be installed within the computing enclosure;

receiving, via a user input device, a user selection from among the user-selectable objects, wherein the user selection specifies an enclosure, an existing component in use, and a future component for future deployment of the modular computing system, wherein the modular computing system can be incrementally deployed based on a number and type of components;

searching a device specific data structure to obtain technical information for the user selection, when the user selection specifies an alternate component that is not directly identified by the user interface;

displaying, at the display device, a representation of the specified enclosure, existing component, and future component with an indicator for a suggested installation configuration that meets an implementation guideline and an indicator of a configuration that does not meet the implementation guideline, wherein the indicator of a configuration that does not meet the implementation guideline includes: providing an indicator of a configuration for the specified one of an enclosure, an existing component, and a future component that does not meet the implementation guideline;

verifying the user selection with respect to the implementation guideline; and displaying, at the display device, an indicator of whether the user selection meets the implementation guideline and an expected performance of using the future component in the deployment of the modular computing system that meets the implementation guideline.

2. The method of claim 1, wherein the implementation guideline corresponds to one of a space requirement, a cabling requirement, a cable length requirement, a weight requirement, a thermal requirement, and a power requirement.

3. The method of claim 1, further comprising providing an alternate configuration for the specified one of an enclosure, an existing component, and a future component that meets the implementation guideline.

4. The method of claim 1, wherein verifying of the implementation guideline is further based on another specified one of an enclosure, an existing component, and a future component.

5. The method of claim 4, wherein the displayed representation includes a representation of the another specified one of an enclosure, an existing component, and a future component.

6. The method of claim 1, wherein the received user selection further specifies one of a communicative coupling, a power coupling, and a thermal coupling of a module of a modular computing system.

7. The method of claim 1, further comprising providing a racking plan including a representation of the modular computing system, the representation including the specified one of an enclosure, an existing component, and a future component.

8. An apparatus for planning an implementation of a modular computing system, comprising:
a non-transitory tangible computer readable storage medium storing a computer program, wherein the computer program has instructions that, when executed by a computer processor, carry out:
presenting, at a display device, a plurality of user-selectable objects, each of the user-selectable objects representing a component of a modular computing system that includes at least a computing module for performing computations, a communication module for communication, a storage device for storage, a power module for providing power and an input/output (I/O) module for receiving user input, wherein the presenting of the user interface includes: presenting a first interface operable to specify a computing enclosure,
presenting a second interface operable to specify a currently-installed component within the computing enclosure, and
presenting a third interface operable to specify a component to be installed within the computing enclosure;
receiving a user selection corresponding to one of the plurality of user-selectable objects, wherein the user selection specifies a represented component as an enclosure, an existing component already in use, and a future component for future deployment at the modular computing system, wherein the modular computing system can be incrementally deployed based on a number and type of components;
searching a device specific data structure to obtain technical information for the user selection, when the user selection specifies an alternate component that is not directly identified by the user interface;
presenting, at the display device, a second display region including a representation of the user selection with an indicator for a suggested installation configuration that meets an implementation guideline and an indicator of a configuration that does not meet the implementation guideline, wherein the an indicator of a configuration that does not meet the implementation guideline includes: providing an indicator of a configuration for the specified one of an enclosure, an existing component, and a future component that does not meet the implementation guideline;
verifying the user selection with respect to the implementation guideline; and
presenting, at the display device, an indicator of whether the user selection meets the implementation guideline of the computing system and an expected performance of using the future component in the deployment of the modular computing system that meets the implementation guideline.

9. The apparatus of claim 8, wherein the instructions for the presenting of the indicator of whether the user selection meets the implementation guideline include further instructions that, when executed, carry out presenting an indicator designating a configuration option that does not meet the implementation guideline.

10. The apparatus of claim 8, wherein the instructions for the presenting of the indicator of whether the user selection meets the implementation guideline include further instructions that, when executed, carry out presenting a suggested configuration option.

11. The apparatus of claim 8, wherein a subset of user-selectable objects of the plurality of user-selectable objects is further operable to specify one of a communicative coupling, a power coupling, and a thermal coupling.

12. The apparatus of claim 8, wherein the implementation guideline corresponds to one of a space requirement, a cabling requirement, a cable length requirement, a weight requirement, a thermal requirement, and a power requirement.

13. A system for planning an implementation of a modular computing system, comprising:
- a memory having stored machine executable code instructions; and
- a processor module coupled to the memory that executes the machine executable code instructions to:
- present a user interface at a display device, the user interface including a plurality of user-selectable objects, each of the user-selectable objects representing a component of the modular computing system that includes at least a computing module for performing computations, a communication module for communication, a storage device for storage, a power module for providing power and an input/output (I/O) module for receiving user input, wherein the present of the user interface includes: a first interface operable to specify a computing enclosure, a second interface operable to specify a currently-installed component within the computing enclosure, and a third interface operable to specify a component to be installed within the computing enclosure;
- receive, via a user input device, a user selection from among the user-selectable objects, wherein the user selection specifies an enclosure, an existing component in use, and a future component for future deployment of the modular computing system, wherein the modular computing system can be incrementally deployed based on a number and type of components;
- search a device specific data structure to obtain technical information for the user selection, when the user selection specifies an alternate component that is not directly identified by the user interface;
- display, at the display device, a representation of the specified enclosure, existing component, and future component with an indicator for a suggested installation configuration that meets an implementation guideline and an indicator of a configuration that does not meet the implementation guideline, wherein the indicator of a configuration that does not meet the implementation guideline includes: provides an indicator of a configuration for the specified one of an enclosure, an existing component, and a future component that does not meet the implementation guideline;
- verify the user selection with respect to the implementation guideline; and
- display, at the display device, an indicator of whether the user selection meets the implementation guideline and an expected performance of using the future component in the deployment of the modular computing system that meets the implementation guideline.

14. The system of claim 13, wherein the implementation guideline corresponds to one of a space requirement, a cabling requirement, a cable length requirement, a weight requirement, a thermal requirement, and a power requirement.

15. The system of claim 13, wherein the executable code when executed provides an alternate configuration for the specified one of an enclosure, an existing component, and a future component that meets the implementation guideline.

16. The system of claim 13, wherein verification of the implementation guideline is further based on another specified one of an enclosure, an existing component, and a future component.

* * * * *